United States Patent
Sum et al.

(10) Patent No.: US 10,598,709 B2
(45) Date of Patent: Mar. 24, 2020

(54) DISTRIBUTED SMART GRID PROCESSING

(71) Applicant: SILVER SPRING NETWORKS, INC., Redwood City, CA (US)

(72) Inventors: Charles P. Sum, Cupertino, CA (US); George H. Flammer, III, Cupertino, CA (US)

(73) Assignee: ITRON NETWORKED SOLUTIONS, INC., Liberty Lake, WA (US)

( * ) Notice: Subject to any disclaimer, the term of this patent is extended or adjusted under 35 U.S.C. 154(b) by 925 days.

(21) Appl. No.: 14/644,003

(22) Filed: Mar. 10, 2015

(65) Prior Publication Data

US 2015/0256435 A1 Sep. 10, 2015

Related U.S. Application Data

(60) Provisional application No. 61/950,425, filed on Mar. 10, 2014, provisional application No. 62/045,423, (Continued)

(51) Int. Cl.
*G01R 25/00* (2006.01)
*H02J 3/00* (2006.01)
(Continued)

(52) U.S. Cl.
CPC ............. *G01R 25/00* (2013.01); *G01R 21/00* (2013.01); *H02J 3/00* (2013.01); *H02J 3/24* (2013.01);
(Continued)

(58) Field of Classification Search
CPC .. G01R 25/00; G01R 21/00; H02J 3/00; H02J 3/24; H02J 3/06; H02J 2003/007;
(Continued)

(56) References Cited

U.S. PATENT DOCUMENTS 8,059,541 B2  11/2011  Karagiannis et al.
8,417,938 B1   4/2013  Considine et al.
(Continued)

FOREIGN PATENT DOCUMENTS

CN   103002005 A   3/2013
EP    2651099 A1  10/2013
(Continued)

OTHER PUBLICATIONS

Jeff Tyson "How the Old Napster Worked" Oct. 30, 2000. HowStuffWorks.com. <http://computer.howstuffworks.com/napster.htm> May 5, 2017; all pages.*
(Continued)

*Primary Examiner* — Fernando Hidalgo
(74) *Attorney, Agent, or Firm* — Artegis Law Group, LLP

(57) ABSTRACT

Nodes within a wireless mesh network are configured to monitor time series data associated with a utility network (or any other device network). One or more servers coupled to the wireless mesh network configures a data ingestion cloud to receive and process the time series data from the nodes to generate data streams. The server(s) also configure a distributed processing cloud to perform historical analysis on data streams, and a real-time processing cloud to perform real-time analysis on data streams. The distributed processing cloud and the real-time processing cloud may interoperate with one another in response to processing the data streams. Specifically, the real-time processing cloud may trigger a historical analysis on the distributed processing cloud, and the distributed processing cloud may trigger real-time processing on the real-time processing cloud. Any of the processing clouds may encompass edge nodes configured to perform real-time processing and generate data streams.

20 Claims, 17 Drawing Sheets

Related U.S. Application Data filed on Sep. 3, 2014, provisional application No. 62/094,907, filed on Dec. 19, 2014.

(51) Int. Cl.

| | | |
|---|---|---|
| *G01R 21/00* | (2006.01) | |
| *H04L 29/08* | (2006.01) | |
| *H04L 29/06* | (2006.01) | |
| *H04L 12/24* | (2006.01) | |
| *H02J 13/00* | (2006.01) | |
| *H02J 3/24* | (2006.01) | |
| *H04L 12/26* | (2006.01) | |
| *H02J 3/06* | (2006.01) | |

(52) U.S. Cl.
CPC ...... *H02J 13/0075* (2013.01); *H04L 41/0803* (2013.01); *H04L 41/0896* (2013.01); *H04L 41/12* (2013.01); *H04L 43/0876* (2013.01); *H04L 43/0888* (2013.01); *H04L 67/125* (2013.01); *H04L 67/16* (2013.01); *H04L 69/28* (2013.01); *H02J 3/06* (2013.01); *H02J 2003/007* (2013.01); *H04L 43/04* (2013.01); *Y02E 60/76* (2013.01); *Y02E 60/7853* (2013.01); *Y04S 40/126* (2013.01); *Y04S 40/164* (2013.01); *Y04S 40/168* (2013.01); *Y04S 40/18* (2018.05); *Y04S 40/22* (2013.01)

(58) Field of Classification Search
CPC . H04L 41/0803; H04L 41/0896; H04L 41/12; H04L 43/0876; H04L 43/0888; H04L 67/125; H04L 67/16; H04L 69/28; H04L 43/04; Y02E 60/76; Y04S 40/22
USPC .......................................................... 702/62
See application file for complete search history.

(56) References Cited

U.S. PATENT DOCUMENTS

| | | |
|---|---|---|
| 8,478,800 B1 | 7/2013 | Johnson et al. |
| 8,504,689 B2 | 8/2013 | Ferris et al. |
| 8,595,642 B1 | 11/2013 | Lagassey |
| 8,612,615 B2 | 12/2013 | Ferris et al. |
| 8,630,283 B1 | 1/2014 | Breau et al. |
| 8,659,302 B1 | 2/2014 | Warren et al. |
| 8,713,147 B2 | 4/2014 | Ferris et al. |
| 8,862,728 B2 | 10/2014 | Jayachandran et al. |
| 8,887,169 B2 | 11/2014 | Wang |
| 8,903,593 B1 | 12/2014 | Addepalli et al. |
| 9,129,086 B2 | 9/2015 | Betz et al. |
| 9,288,123 B1 | 3/2016 | Safford et al. |
| 9,294,552 B2 | 3/2016 | Jimenez et al. |
| 9,319,372 B2 | 4/2016 | Deurloo |
| 9,396,287 B1 | 7/2016 | Bhave et al. |
| 2002/0005798 A1 | 1/2002 | Wada et al. |
| 2002/0016639 A1 | 2/2002 | Smith et al. |
| 2003/0065805 A1 | 4/2003 | Barnes, Jr. |
| 2003/0126276 A1 | 7/2003 | Kime et al. |
| 2004/0012491 A1 | 1/2004 | Kulesz et al. |
| 2004/0036261 A1 | 2/2004 | Breed |
| 2006/0088013 A1 | 4/2006 | Ganesh |
| 2008/0100436 A1 | 5/2008 | Banting et al. |
| 2008/0140471 A1* | 6/2008 | Ramsey ................. G06Q 10/04 702/179 |
| 2008/0209568 A1 | 8/2008 | Chang et al. |
| 2008/0264164 A1 | 10/2008 | Solheim et al. |
| 2008/0317050 A1 | 12/2008 | Xiong et al. |
| 2009/0187658 A1 | 7/2009 | Williams et al. |
| 2010/0088150 A1 | 4/2010 | Mazhar et al. |
| 2010/0146085 A1 | 6/2010 | Van Wie et al. |
| 2010/0198655 A1 | 8/2010 | Ketchum et al. |
| 2010/0257227 A1 | 10/2010 | McLaughlin et al. |
| 2010/0286937 A1 | 11/2010 | Hedley et al. |
| 2011/0077790 A1 | 3/2011 | Vaswani et al. |
| 2011/0078302 A1 | 3/2011 | Dehaan et al. |
| 2011/0298301 A1* | 12/2011 | Wong ................. H04L 12/2827 307/116 |
| 2011/0307623 A1 | 12/2011 | George et al. |
| 2011/0314320 A1 | 12/2011 | Chang et al. |
| 2012/0060142 A1 | 3/2012 | Fliess et al. |
| 2012/0066670 A1 | 3/2012 | McCarthy et al. |
| 2012/0079097 A1 | 3/2012 | Gopisetty et al. |
| 2012/0117392 A1 | 5/2012 | Turicchi, Jr. et al. |
| 2012/0136909 A1 | 5/2012 | Wang et al. |
| 2012/0137126 A1 | 5/2012 | Matsuoka et al. |
| 2012/0150775 A1 | 6/2012 | Son et al. |
| 2012/0153824 A1 | 6/2012 | Neate |
| 2012/0203388 A1 | 8/2012 | DiLuciano et al. |
| 2012/0239468 A1 | 9/2012 | Yemeni et al. |
| 2012/0254400 A1 | 10/2012 | Iyengar et al. |
| 2012/0290651 A1* | 11/2012 | Westbrooke ............. H04Q 9/00 709/204 |
| 2012/0297016 A1 | 11/2012 | Iyer et al. |
| 2012/0310423 A1 | 12/2012 | Taft |
| 2012/0310424 A1 | 12/2012 | Taft |
| 2013/0013125 A1 | 1/2013 | Booth |
| 2013/0013284 A1 | 1/2013 | Wang et al. |
| 2013/0060933 A1 | 3/2013 | Tung et al. |
| 2013/0061306 A1 | 3/2013 | Sinn |
| 2013/0139152 A1 | 5/2013 | Chang et al. |
| 2013/0198050 A1 | 8/2013 | Shroff et al. |
| 2013/0208966 A1 | 8/2013 | Zhao et al. |
| 2013/0227569 A1 | 8/2013 | Kohli et al. |
| 2013/0229947 A1 | 9/2013 | Vaswani et al. |
| 2013/0262642 A1 | 10/2013 | Kutch |
| 2013/0275527 A1 | 10/2013 | Deurloo |
| 2013/0275528 A1 | 10/2013 | Miner et al. |
| 2013/0276089 A1 | 10/2013 | Tseitlin et al. |
| 2013/0305093 A1 | 11/2013 | Jayachandran et al. |
| 2013/0325924 A1 | 12/2013 | Moshfeghi |
| 2014/0012524 A1 | 1/2014 | Flammer, III |
| 2014/0012574 A1 | 1/2014 | Pasupalak et al. |
| 2014/0013244 A1 | 1/2014 | Lindsay et al. |
| 2014/0047107 A1 | 2/2014 | Maturana et al. |
| 2014/0058572 A1 | 2/2014 | Stein et al. |
| 2014/0122729 A1 | 5/2014 | Hon et al. |
| 2014/0146052 A1 | 5/2014 | Takamura et al. |
| 2014/0156806 A1 | 6/2014 | Karpistsenko et al. |
| 2014/0310714 A1 | 10/2014 | Chan et al. |
| 2014/0337274 A1 | 11/2014 | Unnikrishnan |
| 2014/0337429 A1 | 11/2014 | Asenjo et al. |
| 2014/0346972 A1* | 11/2014 | Tran ................... F24F 11/0009 315/307 |
| 2014/0366155 A1 | 12/2014 | Chang et al. |
| 2015/0006716 A1* | 1/2015 | Suchter ................. G06F 9/5038 709/224 |
| 2015/0019301 A1 | 1/2015 | Jung et al. |
| 2015/0032464 A1 | 1/2015 | Vesto |
| 2015/0033120 A1 | 1/2015 | Cooke et al. |
| 2015/0052992 A1 | 2/2015 | Pabst |
| 2015/0058447 A1 | 2/2015 | Albisu |
| 2015/0097961 A1 | 4/2015 | Ure et al. |
| 2015/0106881 A1 | 4/2015 | Wharton et al. |
| 2015/0199010 A1 | 7/2015 | Coleman et al. |
| 2015/0212663 A1 | 7/2015 | Papale et al. |
| 2015/0215332 A1 | 7/2015 | Curcic et al. |
| 2015/0222495 A1 | 8/2015 | Mehta et al. |
| 2015/0233962 A1 | 8/2015 | Tchoryk et al. |
| 2015/0235035 A1 | 8/2015 | Tseitlin et al. |
| 2015/0248452 A1 | 9/2015 | Dillenberger et al. |
| 2015/0295765 A1 | 10/2015 | Dickey |
| 2015/0304337 A1 | 10/2015 | Nguyen-Tuong et al. |
| 2016/0125083 A1 | 5/2016 | Dou et al. |
| 2016/0216698 A1 | 7/2016 | Yoshida et al. |
| 2016/0239264 A1 | 8/2016 | Mathur et al. |
| 2016/0239756 A1 | 8/2016 | Aggour et al. |
| 2016/0254944 A1 | 9/2016 | Larsson et al. |

(56) References Cited

U.S. PATENT DOCUMENTS

2017/0201606 A1 7/2017 Ding et al.
2017/0316048 A1 11/2017 Papageorgiou et al.

FOREIGN PATENT DOCUMENTS

WO 2012/166872 A2 12/2012
WO 2013/006273 A2 1/2013

OTHER PUBLICATIONS

International Search Report and Written Opinion for Application No. PCT/US2015/019733 dated Jun. 17, 2015.
International Search Report and Written Opinion for Application No. PCT/US15/19703 dated Jul. 28, 2015.
Extended European Search Report for Application No. EP 15761205.2 dated Jul. 10, 2017, 13 pages.
Extended European Search Report for Application No. EP 15761724.2 dated Aug. 30, 2017, 7 pages.
European Search report for application No. 18205149.0 dated Mar. 8, 2019.
Zhang et al., "Time-Series Pattern Based Effective Noise Generation for Privacy Protection on Cloud", 2015.
Buyya et al., "Intercloud: Utility-Oriented Federation of Cloud Computing Environments for Scaling of Application Services", "Algorithms and Architectures for Parallel Processing", 2010, pp. 13-31 (Year: 2010).
Wikipedia, "time series", 2017.
Akyildiz et al., "A Survey on Sensor Networks", 2002.
Akyildiz et al., "Wireless sensor networks: a survey", 2002.
Chong et al., "Sensor Networks: Evolution, Opportunities, and Challenges", 2003.
Krishnamachari et al., "Distributed Bayesian Algorithms for Fault-Tolerant Event Region Detection in Wireless Sensor Networks", 2004.
Lu et al., "RAP: A Real-Time Communication Architecture for Large_scale Wireless Sensor Networks", 2002.
Stankovic et al., "Real-Time Communication and Coordination in Embedded Sensor Networks", 2003.
Beal, "Cloud Computing", NIST Cloud Computing Introduction and Definition, webopedia, 2018, 1 pages.
Advisory Action dated Nov. 14, 2018 for U.S. Appl. No. 14/643,978, 5 pages.
Final Office Action received for U.S. Appl. No. 14/643,978, dated Aug. 7, 2018, 39 pages.
Non-Final Office Action received for U.S. Appl. No. 14/643,978, dated Apr. 25, 2019, 35 pages.
Advisory Action dated Sep. 3, 2019 for U.S. Appl. No. 14/643,985, 3 pages.
Advisory Action dated Oct. 5, 2018 for U.S. Appl. No. 14/643,985, 3 pages.
Final Office Action received for U.S. Appl. No. 14/643,985, dated Jun. 24, 2019, 21 pages.
Final Office Action received for U.S. Appl. No. 14/643,985, dated Jul. 23, 2018, 27 pages.

\* cited by examiner

DISTRIBUTED SMART GRID PROCESSING

CROSS-REFERENCE TO RELATED APPLICATIONS

This application claims the benefit of U.S. provisional patent application titled "Smart Grid Processing to Evaluate Grid Conditions," filed on Mar. 10, 2014, and having Ser. No. 61/950,425, U.S. provisional patent application titled "Distributed Smart Grid Processing," filed on Sep. 3, 2014 and having Ser. No. 62/045,423, and U.S. provisional patent application titled "Distributed Smart Grid Processing," filed on Dec. 19, 2014 and having Ser. No. 62/094,907. The subject matter of each of these related applications is hereby incorporated by reference.

BACKGROUND OF THE INVENTION

Field of the Invention

Embodiments of the present invention relate generally to network architecture and semantics for distributed processing on a data pipeline, and, more specifically, to distributed smart grid processing.

Description of the Related Art

A conventional electricity distribution infrastructure typically includes a plurality of energy consumers, such as houses, business, and so forth, coupled to a grid of intermediate distribution entities, such as transformers, feeders, substations, etc. The grid of distribution entities draws power from upstream power plants and distributes that power to the downstream consumers. In a modern electricity distribution infrastructure, the consumers, as well as the intermediate distribution entities, sometimes include "smart" meters and other monitoring hardware coupled together to form a mesh network. The smart meters and other measurement and control devices collect data that reflects the operating state of the grid, as well as consumption and utilization of the grid, and then report the collected data, via the mesh network, to a centralized grid management facility, often referred to as the "back office." Such a configuration is commonly known as a "smart grid."

In a conventional smart grid, the back office receives a multitude of real-time data from the various smart meters and processes that data to identify specific operating conditions associated with the grid. Those conditions may include electrical events, such as sags or swells, as well as physical events, such as downed power lines or overloaded transformers, among other possibilities. The back office usually includes centralized processing hardware, such as a server room or datacenter, configured to process the smart meter data.

One problem with approach described above is that, with the expansion of smart grid infrastructure, the amount of data that must be transmitted to the back office for processing is growing quickly. Consequently, the network across which the smart meters transmit data can become quickly over-burdened with traffic and, therefore, suffer from throughput and latency issues. In addition, the processing hardware implemented by the back office may quickly become too slow, and therefore obsolete, as the amount of data that must be processed continues to grow in response to increased demand. As a general matter, the infrastructure required to transport and process data generated by a smart grid cannot scale nearly as quickly as the amount of data that is generated by the smart grid system.

As the foregoing illustrates, what is needed in the art is a more effective approach for transporting and processing data within large-scale network architectures.

SUMMARY OF THE INVENTION

One embodiment of the present invention sets forth a computer-implemented method for generating network-based data services, including configuring a first cloud computing environment to acquire a sequence of data values and convert the sequence of data values into a first data stream, configuring a second cloud computing environment to accumulate the first data stream into a data archive and to perform a historical analysis on the first data stream to identify a first trend associated with the first data stream, configuring a third cloud computing environment to perform one or more real-time processing operations on the first data stream to determine that a first condition associated with the first data stream has been met, and providing a subscriber to the network-based data services with access to the first data stream, the first trend, and an indication that the first condition has been met.

At least one advantage of the unique architecture described above is that the real-time processing cloud and the distributed processing cloud can interoperate to identify a greater range of events occurring within the utility network compared to traditional approaches.

BRIEF DESCRIPTION OF THE DRAWINGS

So that the manner in which the above recited features of the present invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

DETAILED DESCRIPTION

In the following description, numerous specific details are set forth to provide a more thorough understanding of the present invention. However, it will be apparent to one of skill in the art that the present invention may be practiced without one or more of these specific details. In other instances, well-known features have not been described in order to avoid obscuring the present invention.

System Overview

In the following disclosure, a multi-layered network architecture is described that includes a utility network, illustrated in FIG. 1, a wireless mesh network, illustrated in FIGS. 2A-2B, and a stream network, illustrated in FIG. 5. The utility network includes hardware configured to transport and distribute electricity. The wireless mesh network includes hardware nodes residing within elements of that utility network, where those nodes are configured to execute firmware and/or software to (i) monitor the utility network and (ii) establish and maintain the wireless mesh network. In addition, the nodes are also configured to execute firmware and/or software to generate the stream network. The stream network includes time series data that is generated and processed by the nodes, and shared between nodes via the wireless mesh network. The stream network operates above the wireless mesh network, which, in turn, operates above the electricity distribution layer.

Figure 1:
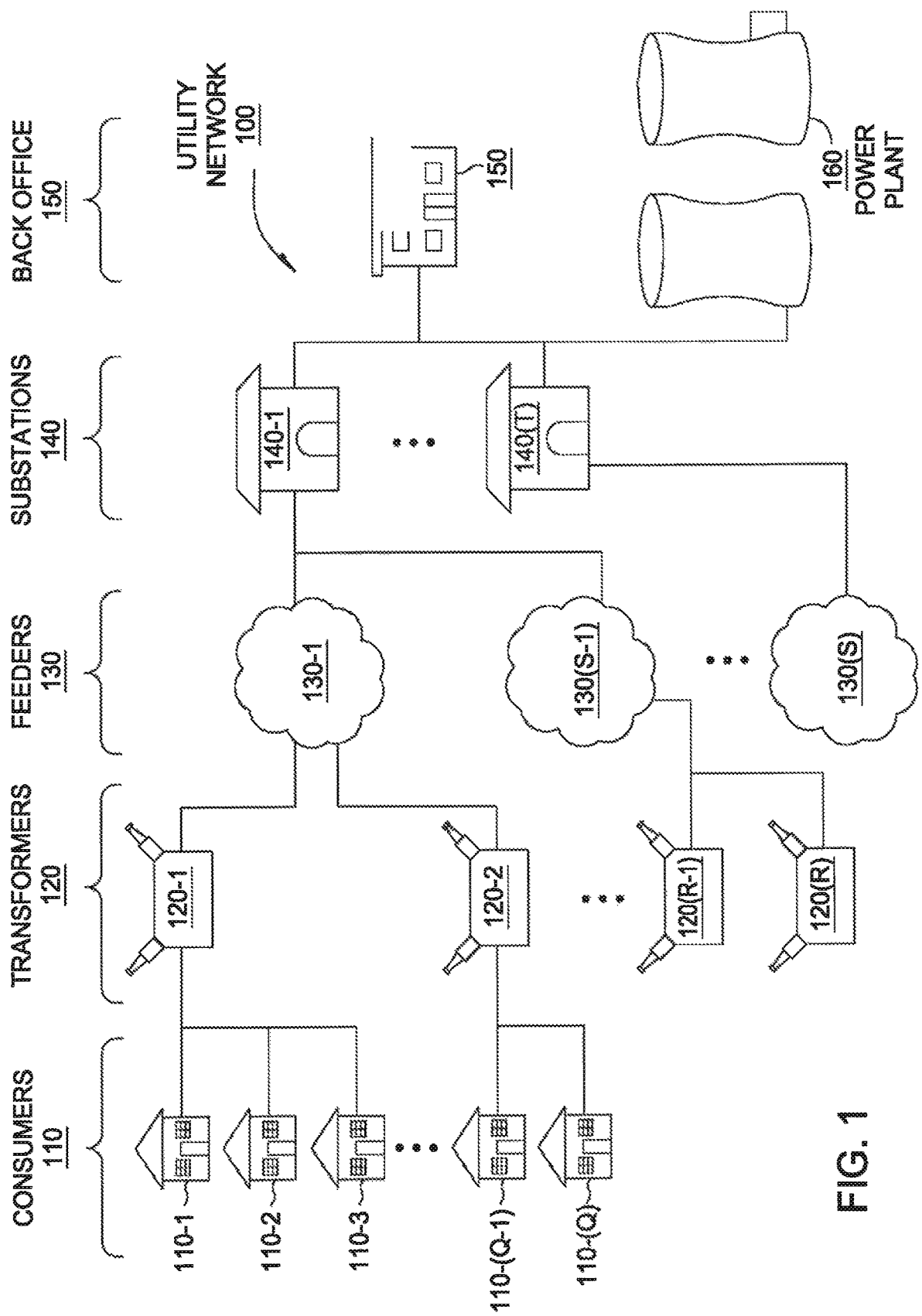
FIG. 1 illustrates a utility network configured to implement an infrastructure for distributing electricity, according to one embodiment of the present invention.

FIG. 1 illustrates a utility network 100 configured to implement an infrastructure for distributing electricity, according to one embodiment of the present invention. As shown, utility network 100 includes consumer 110, transformers 120, feeders 130, substations 140, and a back office 150, coupled together in a sequence. Substations 140(1) through 140(T) are configured to draw power from one or more power plants 160 and to distribute that power to feeders 130(1) through 130(S). Feeders 130, in turn, distribute that power to transformers 120(1) through 120(R). Transformers 120 step down high-voltage power transported by feeders 130 to a low-voltage power, and then transmit the low-voltage power to consumers 110(1) through 110(Q). Consumers 110 include houses, business, and other consumers of power.

Each of consumers 110, transformers 120, feeders 130, and substations 140 may include one or more instances of a node. In the context of this disclosure, a "node" refers to a computing device that is coupled to an element of utility network 100 and includes a sensor array and a wireless transceiver. An exemplary node is described below in conjunction with FIG. 3. Each such node is configured to monitor operating conditions associated with a specific portion of the utility network 100. For example, consumer 110(1) could include a node configured to monitor a number of kilowatt-hours consumed by consumer 110(1). In another example, transformer 120(R-1) could include a node configured to monitor voltage levels or temperature at transformer 120(R-1). In yet another example, feeder 130(S) could include one or more nodes configured to monitor humidity percentages or wind velocities at various locations associated with feeder 130(S). As a general matter, the nodes within utility network 110 may be smart meters, Internet of Things (IoT) devices configured to stream data, or other computing devices. The nodes within utility network 100 may be configured to record physical quantities associated with power distribution and consumption along utility network 100, record physical quantities associated with the environment where utility network 100 resides, record quality of service data, or record any other technically feasible type of data.

The nodes residing within utility network 100 are configured to communicate with one another to form an interconnected wireless mesh network. An exemplary wireless mesh network is described in greater detail below in conjunction with FIGS. 2A-2B. Back office 150 is coupled to this wireless mesh network and configured to coordinate the overall operation of the network and, in some cases, the corresponding nodes. In doing so, back office 150 may configure nodes to record specific data and to establish communication with neighboring nodes. In addition, back office 150 may program the nodes to execute "stream functions" to process incoming time series data, thereby generating data streams. In one embodiment, this configuration is performed in a distributed processing cloud. The incoming time series data could include raw data recorded at the node, or data streams received from neighboring nodes. Back office 150 may collect the generated data streams, and, by processing those streams, identify various events occurring within utility network 100. Back office 150 may then take specific actions in response to those identified events. In some embodiments, the node management functionality discussed above is performed by a separate "operations center," discussed in greater detail below in conjunction with FIG. 6. In other embodiments, any of the aforementioned management functionality may also occur within a cloud-based processing environment.

Figure 2A:
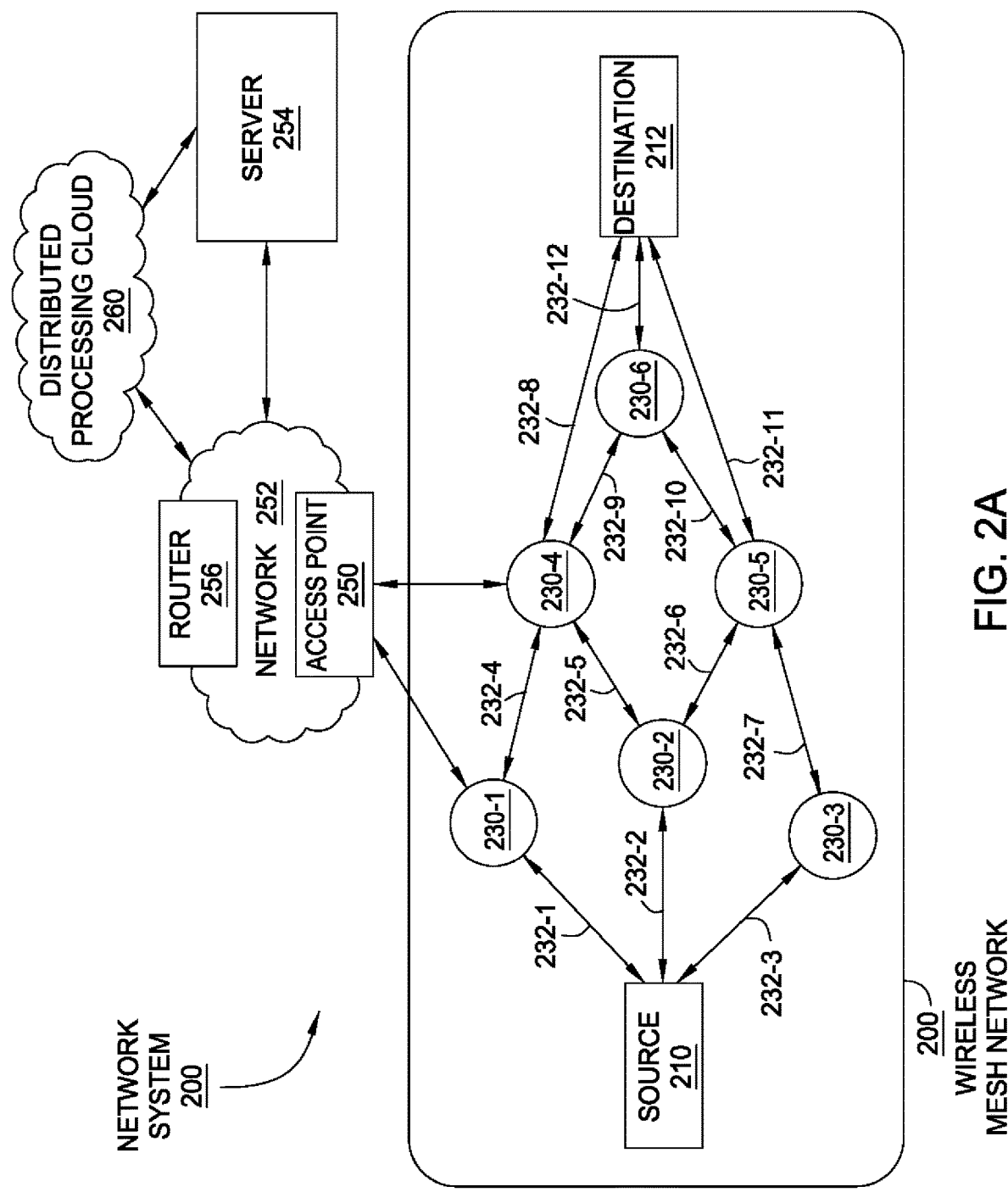
FIG. 2A illustrates a mesh network that operates in conjunction with the utility network of FIG. 1, according to one embodiment of the present invention.

FIG. 2A illustrates a mesh network that operates in conjunction with utility network 100 of FIG. 1, according to one embodiment of the present invention. As shown, a network system 200 includes a wireless mesh network 202, which may include a source node 210, intermediate nodes 230 and destination node 212. Source node 210 is able to communicate with certain intermediate nodes 230 via communication links 232. Intermediate nodes 230 communicate amongst themselves via communication links 232. Intermediate nodes 230 communicate with destination node 212 via communication links 232. In one embodiment, each of nodes 230 may communicate with other nodes using a specific set of frequencies, and may respond to queries from other (non-node) devices using a different set of frequencies. Network system 200 may also include an access point 250, a network 252, a server machine 254, and a router 256. Network 252 and server machine 254 may be coupled to a distributed processing cloud 260, which generally resides outside of network system 200. As mentioned above in conjunction with FIG. 1, a given node 230 (or a source node 210 or a destination node 212) may reside within any of the elements of utility network 100, including consumers 110, transformers 120, and so forth. The various nodes 230 shown in FIG. 2A may also be coupled to various IoT devices, as described in greater detail below in conjunction with FIG. 2B.

Figure 2B:
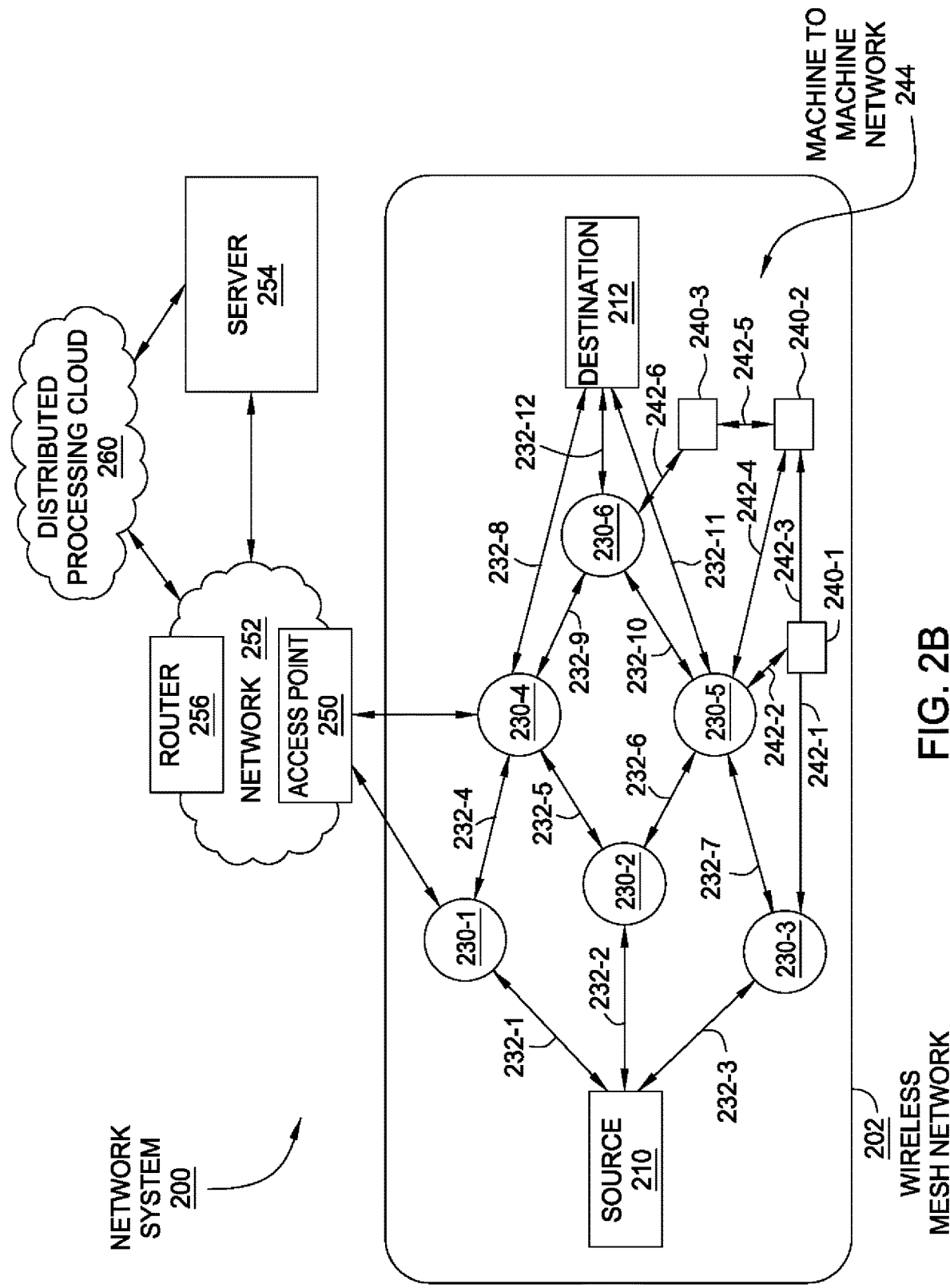
FIG. 2B illustrates the mesh network of FIG. 2A coupled to a machine-to-machine (M2M) network, according to one embodiment of the present invention.

FIG. 2B illustrates the mesh network of FIG. 2A coupled to a machine-to-machine (M2M) network, according to one embodiment of the present invention. As shown, devices 240 are coupled to one another and to various nodes 230 via connections 244, thereby forming M2M network 244. Each of devices 240 may be any technically feasible IoT device, including a smart appliance, a smart traffic light, or any other device configured to perform wireless communications. Devices 240 may communicate with one another directly via specific connections 242, or communication with one another indirectly by way of nodes 230. Each device 240 may gather various types of data and communicate that data to one or more nodes 230. The data gathered by a given device 240 generally includes real-time data such as, e.g., a sequence of recorded values and timestamps indicating when each value was recorded.

Referring generally to FIGS. 2A-2B, a discovery protocol may be implemented to determine node adjacency to one or more adjacent nodes. For example, intermediate node 230-2 may execute the discovery protocol to determine that nodes 210, 230-4, and 230-5 are adjacent to node 230-2. Furthermore, this node adjacency indicates that communication links 232-2, 232-5, and 232-6 may be established with nodes 110, 230-4, and 230-5, respectively. Any technically feasible discovery protocol, including one related to IoT and/or M2M principles, may be implemented without departing from the scope and spirit of embodiments of the present invention.

The discovery protocol may also be implemented to determine the hopping sequences of adjacent nodes, i.e., the sequence of channels across which nodes periodically receive payload data. As is known in the art, a "channel" may correspond to a particular range of frequencies. Once adjacency is established between source node 210 and at least one intermediate node 230, source node 210 may generate payload data for delivery to destination node 212, assuming a path is available. The payload data may comprise an Internet protocol (IP) packet, an Ethernet frame, or any other technically feasible unit of data. Similarly, any technically feasible addressing and forwarding techniques may be implemented to facilitate delivery of the payload data from source node 210 to destination node 212. For example, the payload data may include a header field configured to include a destination address, such as an IP address or Ethernet media access control (MAC) address.

Each intermediate node 230 may be configured to forward the payload data based on the destination address. Alternatively, the payload data may include a header field configured to include at least one switch label to define a predetermined path from source node 210 to destination node 212. A forwarding database may be maintained by each intermediate node 230 that indicates which of communication links 232 should be used and in what priority to transmit the payload data for delivery to destination node 212. The forwarding database may represent multiple paths to the destination address, and each of the multiple paths may include one or more cost values. Any technically feasible type of cost value may characterize a link or a path within network system 200. In one embodiment, each node within wireless mesh network 202 implements substantially identical functionality and each node may act as a source node, destination node or intermediate node.

In network system 200, access point 250 is configured to communicate with at least one node within wireless mesh network 202, such as intermediate node 230-4. Communication may include transmission of payload data, timing data, or any other technically relevant data between access point 250 and the at least one node within wireless mesh network 202. For example, a communication link may be established between access point 250 and intermediate node 230-4 to facilitate transmission of payload data between wireless mesh network 202 and network 252. Network 252 is coupled to server machine 254 via a communications link. Access point 250 is coupled to network 252, which may comprise any wired, optical, wireless, or hybrid network configured to transmit payload data between access point 250 and server machine 254.

In one embodiment, server machine 254 represents a destination for payload data originating within wireless mesh network 202 and a source of payload data destined for one or more nodes within wireless mesh network 202. Server machine 254 generally resides within an operations center or other cloud-based environment configured to manage wireless mesh network 202. For example, server machine 254 could be implemented by a datacenter that includes a number of different computing devices networked together. In one embodiment, server machine 254 executes an application for interacting with nodes within wireless mesh network 202. For example, nodes within wireless mesh network 202 may perform measurements to generate data that reflects operating conditions of utility network 100 of FIG. 1, including, e.g., power consumption data, among other measurements. Server machine 254 may execute an application to collect, process, and report those measurements and any other computed values. In one embodiment, server machine 254 queries nodes 230 within wireless mesh network 202 for certain data. Each queried node replies with the requested data, such as consumption data, system status, health data, and so forth. In an alternative embodiment, each node within wireless mesh network 202 autonomously reports certain data, which is collected by server machine 254 as the data becomes available via autonomous reporting. Persons skilled in the art will recognize that the techniques described herein are applicable to any technically feasible type of network, beyond utility networks.

As described in greater detail below in conjunction with FIGS. 4-15, server machine 254 is configured to establish and maintain the aforementioned stream network that operates above wireless mesh network 202. More specifically, server machine 254 configures the nodes 230 within wireless mesh network 202 to implement "stream functions" in order to generate data streams and process real-time data. A stream function may be any technically feasible algorithm or computational programming function for processing and/or monitoring real-time data. A data stream represents real-time data that is generated by execution of a stream function. The stream network generally includes the various data streams and the paths through mesh network 202 followed by those data streams. The stream network is described in greater detail below in conjunction with FIGS. 5-15.

In one embodiment, server machine 254 may interact with distributed processing cloud 260 to perform some or all of the stream network configuration and stream function execution. Distributed processing cloud 260 may be a private or a public distributed processing cloud, and may include a combination of different processing clouds. Distributed processing cloud 260 may define a configurable data processing pipeline that affects a logical data network path above the physical node paths within mesh network 102.

The techniques described herein are sufficiently flexible to be utilized within any technically feasible network environment including, without limitation, a wide-area network (WAN) or a local-area network (LAN). Moreover, multiple network types may exist within a given network system 200. For example, communications between two nodes 230 or between a node 230 and the corresponding access point 250 may be via a radio-frequency local-area network (RF LAN), while communications between multiple access points 250 and the network may be via a WAN such as a general packet radio service (GPRS). As mentioned above, each node 230 within wireless mesh network 202 includes a network interface that enables the node to communicate wirelessly with other nodes. An exemplary network interface is described below in conjunction with FIG. 3.

Figure 3:
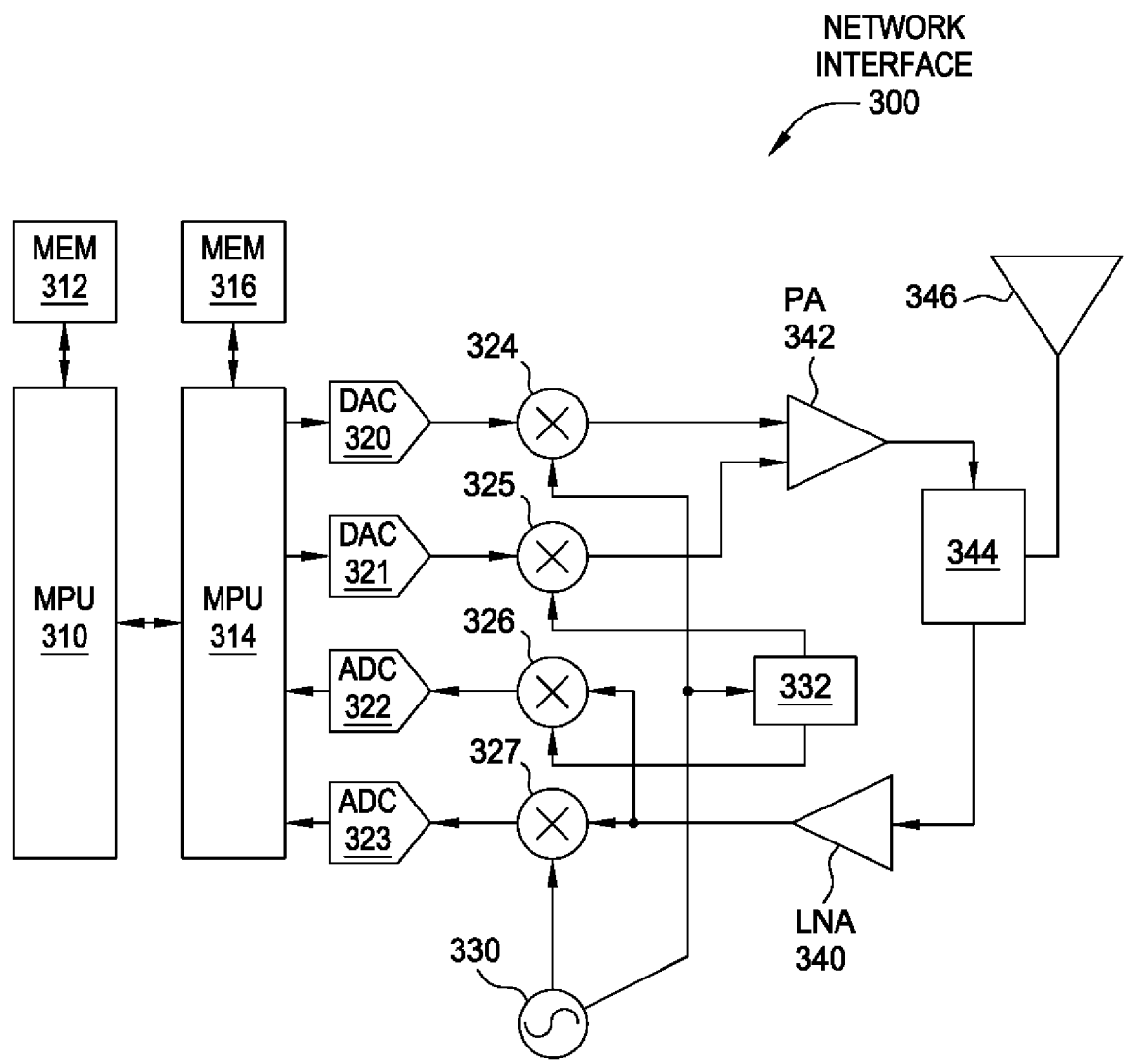
FIG. 3 illustrates a network interface configured to implement multi-channel operation, according to one embodiment of the present invention.

FIG. 3 illustrates a network interface 300 configured to implement multi-channel operation, according to one embodiment of the present invention. Each node 210, 212, 230 within wireless mesh network 202 of FIGS. 2A-2B includes at least one instance of network interface 300. Network interface 300 may include, without limitation, a microprocessor unit (MPU) 310, a digital signal processor (DSP) 314, digital to analog converters (DACs) 320 and 321, analog to digital converters (ADCs) 322 and 323, analog mixers 324, 325, 326, and 327, a phase shifter 332, an oscillator 330, a power amplifier (PA) 342, a low noise amplifier (LNA) 340, an antenna switch 344, and an antenna 346. A memory 312 may be coupled to MPU 310 for local program and data storage. Similarly, a memory 316 may be coupled to DSP 314 for local program and data storage. Memory 312 and/or memory 316 may be used to store data structures such as, e.g., a forwarding database, and/or routing tables that include primary and secondary path information, path cost values, and so forth.

In one embodiment, MPU 310 implements procedures for processing IP packets transmitted or received as payload data by network interface 300. The procedures for processing the IP packets may include, without limitation, wireless routing, encryption, authentication, protocol translation, and routing between and among different wireless and wired network ports. In one embodiment, MPU 310 implements the techniques performed by the node when MPU 310 executes firmware and/or software programs stored in memory within network interface 300.

MPU 314 is coupled to DAC 320 and DAC 321. Each DAC 320, 321 is configured to convert a stream of outbound digital values into a corresponding analog signal. The outbound digital values are computed by the signal processing procedures for modulating one or more channels. MPU 314 is also coupled to ADC 322 and ADC 323. Each of ADC 322 and 323 is configured to sample and quantize an analog signal to generate a stream of inbound digital values. The inbound digital values are processed by the signal processing procedures to demodulate and extract payload data from the inbound digital values. Persons having ordinary skill in the art will recognize that network interface 300 represents just one possible network interface that may be implemented within wireless mesh network 202 shown in FIGS. 2A-2B, and that any other technically feasible device for transmitting and receiving data may be incorporated within any of the nodes within wireless mesh network 202. As a general matter, server machine 254 of FIGS. 2A-2B configures and manages the operation of each node 230 where network interface 300 resides.

Figure 4A:
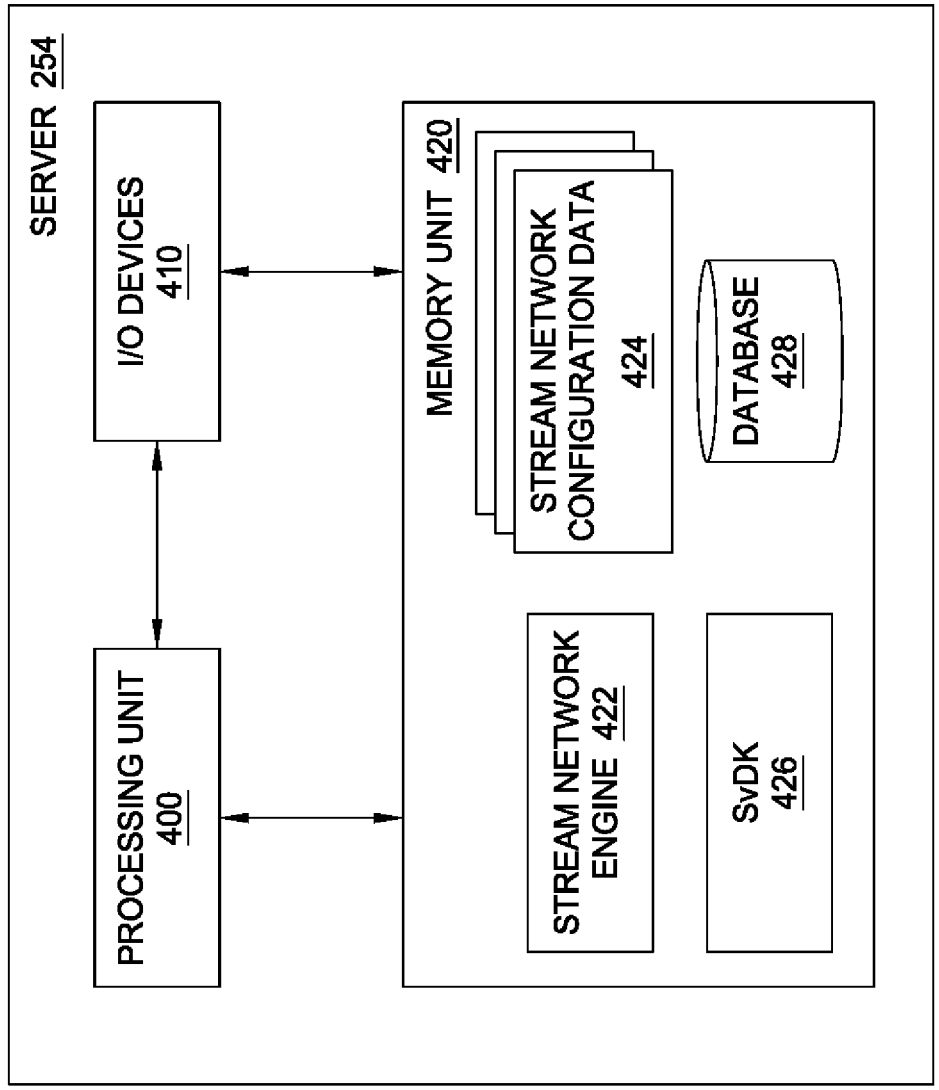
FIG. 4A illustrates a server machine coupled to the mesh network of FIG. 2, according to one embodiment of the present invention.

FIG. 4A illustrates server machine 254 that is coupled to wireless mesh network 202 of FIG. 2, according to one embodiment of the present invention. As shown, server machine 254 includes processing unit 400, input/output (I/O) devices 410, and memory unit 420, coupled together. Memory unit 420 includes stream network engine 422, stream network data 424, stream software developer kit (SvDK) 426, and database 428.

Processing unit 400 may be any technically feasible hardware unit or collection of units configured to process data, including a central processing unit (CPU), a graphics processing unit (GPU), a parallel processing unit (PPU), a field-programmable gate array (FPGA), an application-specific integrated circuit (ASIC), or any combination thereof. Processing unit 400 is configured to perform I/O operations via I/O devices 410, as well as to read data from and write data to memory unit 420. In particular, processing unit 400 is configured to execute program code included in stream network engine 400 and SvDK 426, generate and/or modify stream network data 424, and read from and/or write to database 428.

I/O devices 410 may include devices configured to receive input, such as, e.g., a keyboard, a mouse, a digital versatile disc (DVD) tray, and so forth. I/O devices 410 may also include devices configured to generate output, such as, e.g., a display device, a speaker, a printer, and so forth. I/O devices 410 may further include devices configured to both receive input and generate output, such as a touchscreen, a data port, and so forth. I/O devices generally provide connectivity to the Internet, and, specifically, to wireless mesh network 202.

Memory unit 420 may be any technically feasible unit configured to store data, including a hard disk, random access memory (RAM), etc. The stored data may include structured data sets, program code, software applications, and so forth. Stream network engine 422 is a software application that may be executed by processing unit 400 to establish and maintain the stream network discussed above in conjunction with FIGS. 1-4, and, further, below in conjunction with FIGS. 5-15. In doing so, stream network engine 422 configures nodes 230 within mesh network 202 to execute stream functions included within stream network data 424. The stream functions generally reflect various operations that can be performed by a node 230 in order to process time series data collected by that node. As described in greater detail below in conjunction with FIGS. 6 and 11, "stream actors" may encapsulate a sequence of one or more stream functions. In one embodiment, the functionality of stream network engine 422 is performed within distributed processing cloud 260 of FIGS. 2A-2B. In another embodiment, server machine 254 executes stream network engine 422 to configure distributed processing cloud 260 to manage nodes 230 and/or execute the stream functions described above.

SvDK 426 is a software application that, when executed by processing unit 400, provides a template-based composition wizard/application to utility customers that allows creation of stream functions. SvDK 426 generates a graphical user interface (GUI) that supports drag-and-drop construction of stream functions and/or node monitoring rules, among other possibilities. SvDK 426 may be implemented as a server configured to provide access to the aforementioned GUI, among other possibilities. SvDK 426 is configured to expose to the customer various abstractions of underlying libraries that encapsulate various application programming interface (API) calls. These abstract libraries enable the customer to generate complex stream functions and stream services that are implemented by complex underlying code, yet require no actual coding on the part of the customer. SvDK 426 enables the customer to generate stream functions and stream services from scratch or based on other stream functions and/or stream services. An exemplary GUI that may be generated by SvDK 426 is described below in FIG. 4B.

Figure 4B:
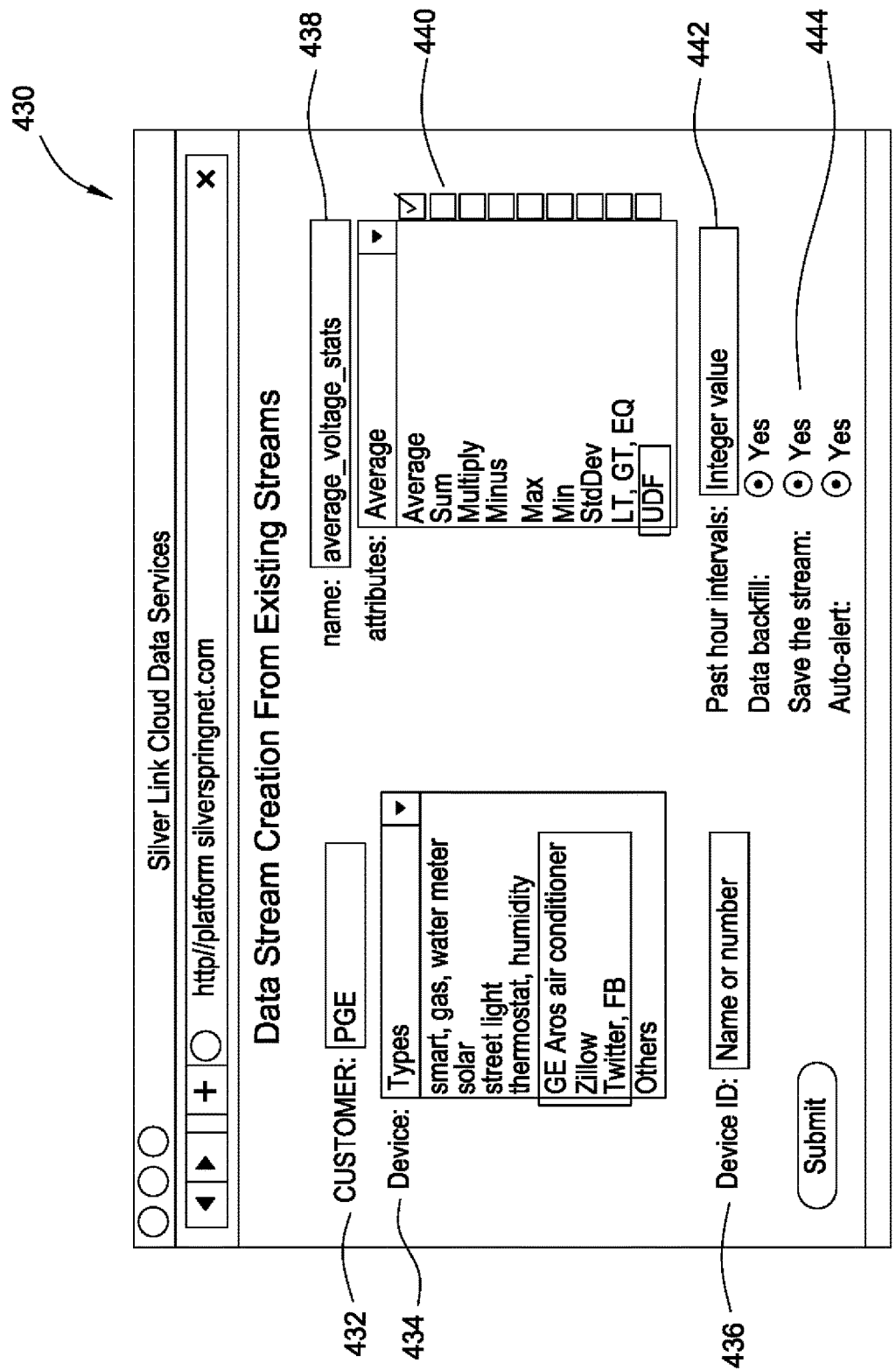
FIG. 4B illustrates a graphical user interface that may be used to define and generate one or more data streams, according to one embodiment of the present invention.

FIG. 4B illustrates a GUI 430 that may be used to generate a data stream, according to one embodiment of the present invention. As shown, GUI 430 includes various GUI elements for making different selections and providing various inputs associated with a data stream, including customer selector 432, input selector 434, device ID input 436, name input 438, attributes selector 440, interval input 442, and options buttons 444. A user of SvDK 426 may interact with GUI 430 in order to define a new data stream service.

In practice, the user selects the customer they represent via customer selector 432, and then identifies, via input selector 434, the specific inputs from which the data stream should receive data. Those inputs could be derived from specific devices, including other nodes 230, or non-utility network data sources such as Facebook® or Twitter®, NOAA climate data, as well as abstract data sources such as previously created and computed streams. The user may also enter a specific device ID via device ID input 436. The user may then provide a name via name input 438 and select the particular function or functions that should be executed on the source data via attributes selector 440. Interval selector 442 allows the user to adjust the frequency with which elements of the data stream are generated. Options buttons 444 allow various other options to be selected. Once the user has configured GUI 430 to include various selections and inputs, the user may submit the data stream configuration defined by those selections and inputs to server machine 254. In response, server machine 254 then configures distributed processing cloud 260, nodes 230, and so forth, to generate that data stream.

Referring back now to FIG. 4A, SvDK 426 may include and/or generate server-side code that executes on processing unit 400 as well as client-side code that executes on a remote computing device or sensory/measurement device associated with a utility customer, as well as code that executes on distributed processing cloud 260. In one embodiment, as mentioned above, SvDK 426 may be a web application that provides users with access to a library of function calls for performing data processing on time series data, including raw time series data generated by a node 230 as well as aggregated data stream time series data received from other nodes. The user may generate a data stream by assembling various function calls via the GUI described above in any desired fashion to process the time series data. The library of function calls and other data used by SvDK 426 may be stored in a local database 428, among other places. Those function calls generally encapsulate specific programmatic operations, including database operations and data processing algorithms, without requiring that the user write actual code. Generally, SvDK 426 allows utility customers to customize a specific portion of the stream network that operates in conjunction with mesh network 202. The stream network discussed thus far is described in greater detail below in conjunction with FIG. 5.

Figure 5:
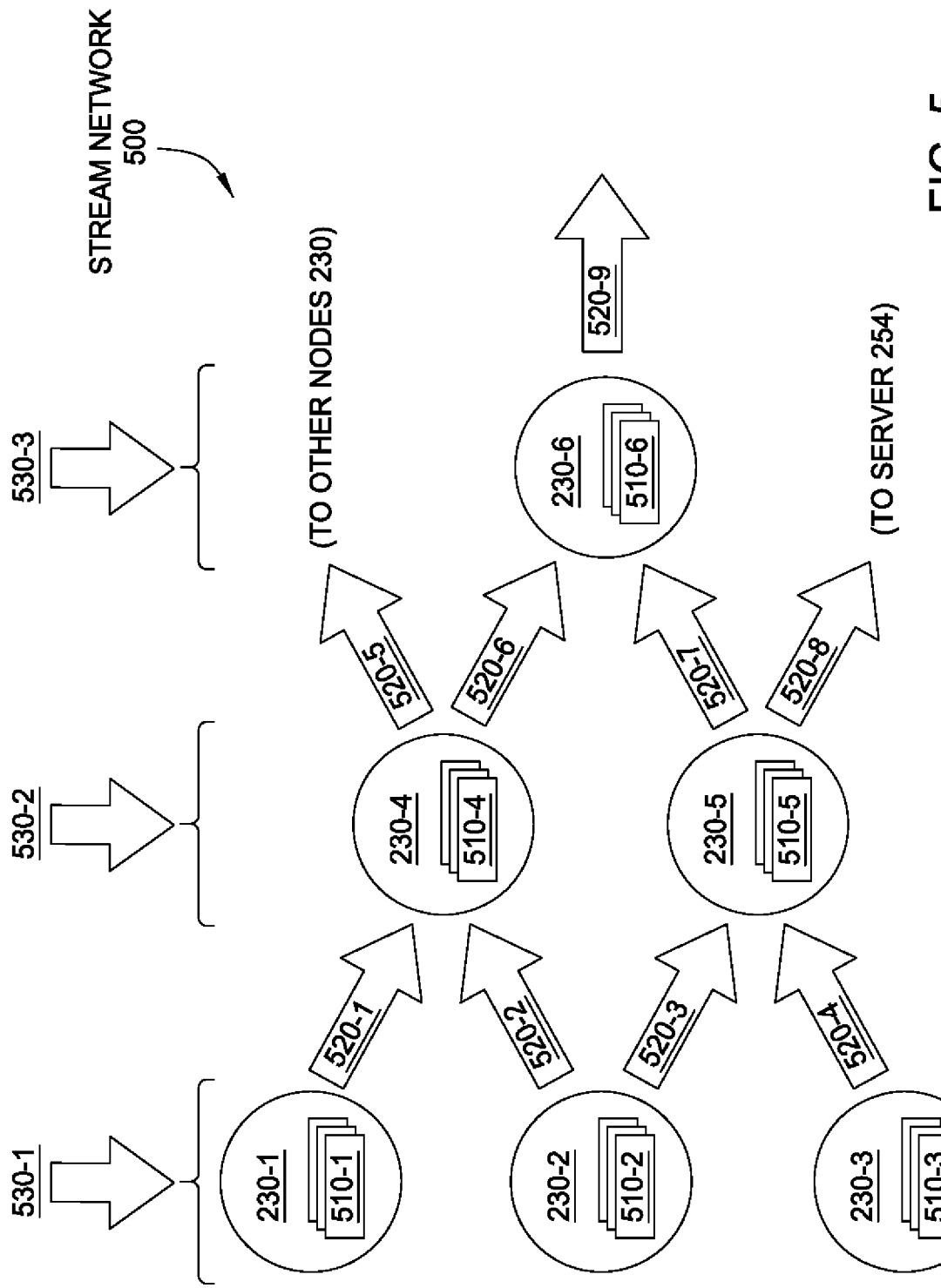
FIG. 5 illustrates a stream network configured to operate in conjunction with the mesh network of FIG. 2, according to one embodiment of the present invention.

FIG. 5 illustrates a stream network 500 configured to operate in conjunction with mesh network 202 of FIG. 2, according to one embodiment of the present invention. Again, as illustrated in greater detail below, stream network 500 operates above mesh network 202 of FIG. 2 in an overall network architecture. As shown, nodes 230 of mesh network 202 execute stream functions 510 in order to generate data streams 520.

Specifically, node 230-1 executes stream functions 510-1 to generate data stream 520-1, node 230-2 executes stream function 510-2 to generate data streams 520-2 and 520-3, node 230-3 executes stream functions 510-3 to generate data stream 520-4, node 230-4 executes stream functions 510-4 to generate data streams 520-5 and 520-6, node 230-5 executes stream functions 510-5 to generate data streams 520-7 and 520-8, and node 230-6 executes stream functions 510-6 to generate stream function 520-9. Each data stream 520 includes a time series of data elements, where each data element includes a data value and a corresponding time-stamp indicating a time when the data values was computed, recorded or generated.

A given node 230 may execute one or more stream functions 510 to process raw time series data generated by that node 230. A stream function 510 may be a Boolean operation, such as, e.g., a comparison, or a more complex, higher-level function, such as a correlation operation. The raw time series data processed by stream functions generally includes various types of sensor data, such as voltage data, current measurements, temperature readings, and other types of environmental and/or non-environmental information. The raw time series data may also include sensor data reflective of the operating conditions of node 230. Further, the raw time series data may include network status information, traffic measurements, and so forth. In one embodiment, each node 230 is configured to access time series data that is derived from various social media outlets, such as Twitter® or Facebook®, among other possibilities. Node 230 could, for example, retrieve tweets in real-time (or near real-time) via an API provided by Twitter®. Node 230 is configured to process the raw time series data to generate one or more data streams 520, and to then transmit the generated data stream(s) 520 to neighboring nodes. Data streams generated by processing raw time series data may be referred to herein as "native data streams."

A given node 230 may also execute one or more stream functions 510 to process data streams 520 received from neighboring nodes 230. A received data stream 520 could be generated by an upstream node 230 based on raw time series data recorded by that node, or generated based on other data streams 520 received by that upstream node. Similar to above, node 230 is configured to process received data streams 520 to generate additional data streams 520, and to then transmit these data stream(s) 520 to neighboring nodes. Data streams generated by processing other data streams may be referred to herein as "abstract data streams."

Upon generating a data stream 520, node 230 is configured to transmit the data stream 520 to back office 150 and/or distributed processing cloud 260, as mentioned. Back office 150 collects data streams 520 from nodes 230 within wireless mesh network 202 and may then perform various additional processing operations with those data streams 520 to identify network events associated with utility network 100 and/or wireless mesh network 202 as well as consumption data. In doing so, server machine 254 may characterize time series data associated with nodes 230, including raw time series data and received data streams, and then identify network events associated with abnormal patterns within that time series data. Those network events may include voltage sags/swells, downed power lines, appliance malfunctions, potential fires, and fraud, among others. Server machine 254 may also process time series data to identify expected or normal patterns, including consumption data, quality of service data, etc. Server machine 254 may then analyze this data to compute load predictions, demand estimations, and so forth. In doing so, server machine 254 may rely on data from abstract data sources, such as Twitter® or Facebook®, to identify possible surges in electricity usage. Server machine 254 may then provide advanced notification to a utility company.

For example, a given node 230 could be configured to participate in identifying voltage swells (or sags) by executing a stream function that generates a running average of voltage levels associated with the node 230. When the voltage level at a given point in time exceeds (or falls below) the running average by a threshold amount, value, node 230 could alert server machine 254. Server machine 254 could then identify that a voltage swell (or sag) is occurring in the region where the node resides and notify the utility provider. Server machine 254 could also identify voltage swells or sags by correlating multiple alerts received from multiple nodes 230 residing within the same region. In general, a node 230 may combine data associated with other devices or data streams to draw insights that reflect consumption, service quality and usage, possible causes of deviations from expected values, as well as bill forecasts.

In another example, a given node 230 could be configured to execute a stream function that generates a running average of voltage load associated with a transformer to which the node 230 is coupled. When the running average exceeds a threshold level for some period of time, the node 230 could notify server machine 254 that a fire may be imminent. The node 230 could also compute the threshold value dynamically by executing a stream function on time series data that reflects ambient temperature associated with the node 230. The node 230 could then adjust the threshold based on the type of transformer, e.g., by executing a stream function to parse nameplate data associated with that transformer and then generate a nominal load value for that particular type of transformer. The node 230 could also receive the threshold value from server machine 254.

In yet another example, a given node 230 could be configured to participate in identifying usage fraud or theft by executing a stream function to characterize usage patterns associated with a consumer to which the node 230 is coupled and then identify patterns commonly associated with fraud. When a usage pattern commonly associated with fraud is detected, the node 230 could notify server machine 254. Such a pattern could be abnormally high consumption compared to prior usage patterns of neighboring consumers, or divergence between measured load at a transformer coupling a set of meters together and total consumed power at those meters, among other possibilities.

Persons skilled in the art will recognize that stream functions designed for performing computations related to any consumable utility may also be applicable to any other consumable utility. For example, the fraud detection techniques outlined above may be applied to identify loss in the context of water consumption. SvDK 426 of FIGS. 4A-4B is configured to allow stream functions generated for one utility to be applied to performing analogous computations with another utility.

A given node 230 may identify network events based on parsing data streams collected from a social media outlet (such as the Twitter® API, among others). For example, a data stream gathered from a social media outlet could reflect descriptions of downed power lines, fallen trees, and other events that may impact the functionality of wireless mesh network 202 and utility network 100. Node 230 could execute a stream function to search that data stream for specific references to such events. Users that contribute to the social media outlet mentioned above would generally create the descriptions included in the data stream in the form of posts, tweets, etc. Node 230 could assign a credibility factor or confidence value to each user in order to validate those descriptions. In this fashion, node 230, and stream network 500 as a whole, may incorporate qualitative data provided by human beings with some level of confidence.

Generally, stream network 500 may be configured to perform a wide variety of distributed processing operations to identify events occurring within underlying networks, including wireless mesh network 202 and utility network 100. Stream network 500 may also be configured to perform general processing operations (i.e., beyond event identification). In one embodiment, server machine 254 may implement a map-reduce type functionality by mapping stream functions to nodes, and then reducing data streams generated by execution of the mapped stream functions by collecting and processing those data streams. In this fashion, server machine 254 is capable of configuring stream network 500 to operate as a generic, distributed computing system. Portions of this distributed computing system may execute on a cloud-based infrastructure in addition to executing on nodes 230. Persons skilled in the art will recognize that server machine 254 may configure stream network 500 to implement any technically feasible form of distributed processing, beyond map-reduce. Generally, stream network 500 reflects a distributed computing system that combines the processing, extrapolation, interpolation, and analysis of data streams using real-time and historical streams via in-line and parallel batch processing.

In one embodiment, server machine 254 and/or distributed processing cloud 260 are configured to orchestrate the distribution of processing tasks and/or data storage across the various nodes 230 within stream network 500 in a centralized manner. In doing so, server machine 254 and/or distributed processing cloud 260 may assign specific processing operations to different nodes, allocate particular amounts of data storage to different nodes, and generally dictate some or all configuration operations to those nodes.

In another embodiment, nodes 230 perform a self-orchestration procedure that occurs in a relatively distributed fashion, i.e. without the involvement of a centralized unit such as server 254 or distributed processing cloud 260. In doing so, each node 230 may execute a stream function in order to negotiate processing and/or data storage responsibilities with neighboring nodes. Nodes 230 may perform such negotiations in order to optimize energy usage, processing throughput, bandwidth, data rates, etc. For example, nodes 230 could negotiate a distribution of processing tasks that leverages the processing capabilities of solar powered nodes during daylight hours, and then redistributes those operations to nodes powered by utility network 100 during non-daylight hours. In another example, a group of nodes 230 could negotiate coordinated communications using a specific data rate to optimize power consumption. At any given time, server 254 and/or distributed processing cloud 260 may assume direct control over nodes 230, thereby causing nodes 230 to transition from self-orchestration to centralized orchestration. In a further embodiment, one or more nodes 130 may perform some or all of the functionality associated with server 154, thereby performing various network management related activities from within wireless mesh network 202.

Nodes 230 may initiate specific actions based on the execution of one or more stream function 510. For example, a given node 230 could execute a stream function 510 that compares temperature and humidity values to threshold temperature and humidity values. The node 230 could then determine that both temperature and humidity have exceeded the respective threshold values for a specific amount of time, and then determine that mold growth is likely at the location occupied by the node. The node 230 could then take specific steps to counteract such growth, including activating a ventilation device, or simply notifying back office 150. Generally, each node 230 is configured to both process and respond to recorded time series data, received data streams, and generated data streams and to generate insights and/or alerts based on such monitoring.

When executing a stream function 510, a given node 230 may receive control parameters 530 from server machine 254 that influence the execution of those stream functions 510. For example, node 230-1 could receive control parameters 530-1 that reflects an average expected voltage load at node 230-1. Node 230-1 could record the actual voltage load, compare that recorded value to control parameters 530-1, and then perform a specific action based on the result, such as, e.g., report to back office 150 a binary value indicating whether the average expected voltage load was exceeded, among other possibilities. In the above example, one of stream functions 510-1 executed by node 230-1 would reflect the comparison operation between actual and expected voltage loads.

In one embodiment, server machine 254 may configure nodes 230 to operate according to a policy that indicates guidelines for interacting with the nodes of other networks. Each node 230 configured according to the policy may share network resources, route packets according to, and generally interoperate with those other nodes based on the policy. For example, node 230 could be configured according to a policy that indicates that 40% of traffic received from a network adjacent to the wireless mesh network 202 should be accepted and routed across wireless mesh network 202 on behalf of the adjacent network. In another example, node 230 could be configured according to another policy that indicates that traffic from a first adjacent network should be routed according to a first set of guidelines, while traffic associated with a second adjacent network should be routed according to second set of guidelines. In yet another example, node 230 could be configured according to a policy that specifies how traffic received from one adjacent network should be routed across wireless mesh network 202 in order to reach another adjacent network. The technique described herein allows new nodes 230 to be added to wireless mesh network and then configured according to the same policy or policies already associated with other pre-existing nodes 230 in the wireless mesh network 202. In addition, this technique allows wireless mesh network 202 to operate in a relatively consistent manner across nodes 230 without requiring continuous querying of server machine 254 with regard to routing decisions. Instead, nodes 230 need only operate according to the configured policy.

Persons skilled in the art will understand that the techniques described thus far may be implemented in any technically feasible architecture, including public and/or private cloud-based implementations, centralized or decentralized implementations, and so forth. One exemplary implementation of the aforementioned techniques is described in greater detail below in conjunction with FIGS. 6-15.

Distributed and Real-Time Stream Processing

Figure 6:
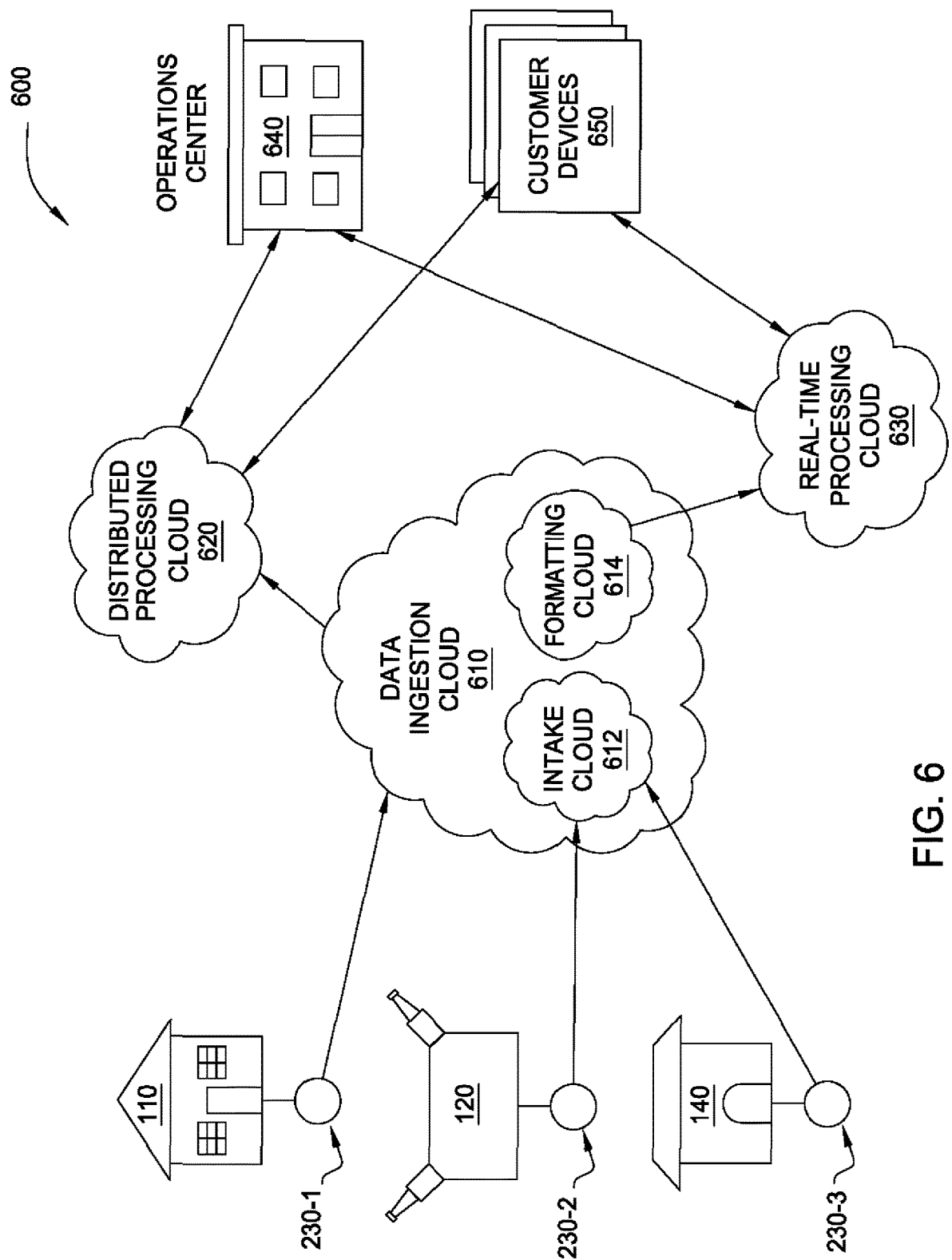
FIG. 6 illustrates a system configured to implement the stream network of FIG. 5, according to one embodiment of the present invention.

FIG. 6 illustrates a system 600 configured to implement the stream network 500 of FIG. 5, according to one embodiment of the present invention. As shown, system 600 includes an exemplary portion of utility network 100, including consumer 110, transformer 120, and substation 140. Consumer 110 is coupled to node 230-1, transformer 120 is coupled to node 230-2, and substation 140 is coupled to node 230-3. Nodes 230-1 through 230-3 form a portion of wireless mesh network 202 of FIG. 2. Each of the nodes 230 within system 600 is coupled to data ingestion cloud 610. Data ingestion cloud 610 includes an intake cloud 612 and a formatting cloud 614. Data ingestion cloud 610 is coupled to distributed processing cloud 620 and real-time processing cloud 630. Distributed processing cloud 620 and real-time processing cloud 630 are coupled to one another, and also both coupled to operations center 640 and customer devices 650.

Nodes 230 are configured to implement stream network 500 shown in FIG. 5 by collecting time series data, processing that data via the execution of stream functions, and then transmitting that data to data ingestion cloud 610. Data ingestion cloud 610 includes cloud-based computing devices configured to implement intake cloud 612 and formatting cloud 612. Intake cloud 610 receives stream data from nodes 230 routes that data to formatting cloud 614. Formatting cloud 614 then formats that stream data to generate data streams. In one embodiment, intake cloud 610 executes on a public cloud infrastructure, such as, e.g., Amazon Web Services (AWS), while formatting cloud executes on a private cloud. Generally, intake cloud 612 and formatting cloud 614 within data ingestion cloud 610 may be distributed across one or more processing clouds in any technically feasible fashion. An exemplary collection of software modules configured to implement intake cloud 612 is described in greater detail below in conjunction with FIG. 7. An exemplary collection of software modules configured to implement formatting cloud 614 is described in greater detail below in conjunction with FIG. 8.

Data ingestion cloud 610 generates data streams and then transmits those streams to distributed processing cloud 620 and real-time processing cloud 630. Distributed processing cloud 620 includes cloud-based computing devices configured to (i) archive historical data associated with data streams in a searchable database and (ii) perform batch processing on that historical data via a distributed compute architecture. An exemplary collection of software modules configured to implement distributed processing cloud 620 is described in greater detail below in conjunction with FIG. 9.

Real-time processing cloud 630 includes cloud-based computing devices configured to process data streams in real time. In doing so, real-time processing cloud 630 may monitor data streams and determine whether various conditions have been met and, if so, issue alerts in response. Real-time processing cloud 630 may also publish specific data streams to particular subscribers. An exemplary collection of software modules configured to implement real-time processing cloud 630 is described in greater detail below in conjunction with FIG. 10.

In one embodiment, distributed processing cloud 620 and real-time processing cloud 630 are configured to interoperate with one another in order to process data streams on behalf of customers of utility network 100. In doing so, processing occurring on one of the aforementioned processing clouds can trigger processing on the other processing cloud, and vice versa.

For example, real-time processing cloud 630 could be configured to process a data stream of voltage values updated every few seconds and monitor that stream for a voltage spike of a threshold magnitude. The occurrence of the voltage spike would trigger real-time processing cloud 630 to initiate an operation on distributed processing cloud that involves the processing of historical stream data spanning a longer time scale, such as months or years. Distributed processing cloud 620 could, in response to real-time processing cloud 630, retrieve historical voltage values associated with a range of different times, and then attempt to identify a trend in those values, such as, for example, previous voltage spikes having the threshold value. Based on the identified trend, distributed processing cloud 620 could then predict future voltage spikes associated with the data stream. Distributed processing cloud 620 could then identify subscribers of the data stream when voltage spikes are expected. In this fashion, real-time analysis of stream data can trigger historical analysis of stream data when specific conditions are met. This type of coordination between distributed processing cloud 620 and real-time processing cloud 630 is described in greater detail below in conjunction with FIG. 14.

In another example, distributed processing cloud 620 could be configured to process a data stream of voltage values across a longer time scale, such as months or years. Distributed processing cloud 620 could then identify a trend in that data stream, and then configured real-time processing cloud 630 to specifically monitor that data stream for specific events indicated by the trend, such as sags, swells, and so forth. In this fashion, historical analysis of stream data can be used to initiate in-depth, real-time analysis. This type of coordination between distributed processing cloud 620 and real-time processing cloud 630 is described in greater detail below in conjunction with FIG. 15.

As a general matter, operations center 640 configures distributed processing cloud 620 and real-time processing cloud 630 to operate in conjunction with one another in either or both of the aforementioned fashions.

Operations center 640 is, more generally, the governing body of stream network 500 and wireless mesh network 202. Operations center 640 may be a control room, a datacenter, and so forth. Server machine 254 resides within operations center 640 and may perform some or all of the functionality of operations center 640 discussed herein. Operations center 640 configures nodes 230 to implement stream network 500 and, additionally, configures data ingestion cloud 610, distributed processing cloud 620, and real-time processing cloud 630. In doing so, operations center 640 may program firmware within each node 230 to execute specific stream functions. Operations center 640 may also instantiate instances of virtual computing devices in order to create the various processing clouds shown. Operations center 640 also provides a visualization service that customers may interact with in order to visualize data streams. An exemplary collection of software modules configured to execute within operations center 640 is described in greater detail below in conjunction with FIG. 11.

Customer devices 650 represent computing devices associated with customers of utility network 100. A customer device 650 may be any technically feasible form of computing device or platform, including a desktop computer, mobile computer, and so forth. A customer may use a customer device 650 to access a web-based portal that allows the customer to subscribe to, generate, and visualize data streams. An exemplary collection of software modules configured to implement a customer device 620 is described in greater detail below in conjunction with FIG. 12.

Figure 7:
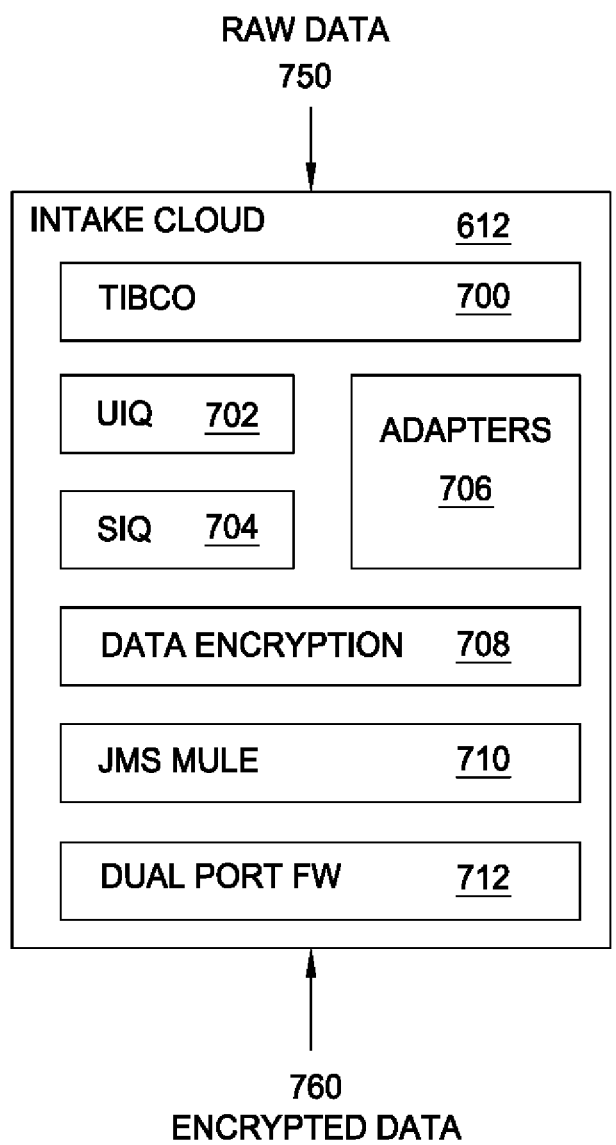
FIG. 7 illustrates exemplary software modules that are implemented in conjunction with the intake cloud of FIG. 6, according to one embodiment of the present invention.

FIG. 7 illustrates exemplary software modules that are implemented in conjunction with the intake cloud of FIG. 6, according to one embodiment of the present invention. As shown, intake cloud 612 includes a TIBCO® module 700, a utility IQ (UIQ) module 702, a sensor IQ (SIQ) module 704, data encryption 706, a Java Messaging Service (JMS) mule 710, and a dual port firewall (FW) 712.

Persons skilled in the art will understand that some of the various software modules shown in FIG. 7 are commonly associated with specific vendors and may represent specific brands. However, these specific modules are provided to illustrate one possible implementation of the general functionality associated with intake cloud 600, and are not meant to limit the scope of the present invention to the particular vendors/brands shown. In addition, although specific data types may be shown, such as, e.g., JSON, among others, the techniques described herein are not limited to those specific data types, and may be practiced with any technically feasible type of data.

TIBCO® 700 is a software bus that receives raw data 750 from nodes 230, including time series data and associated time stamps. UIQ 702 is a low-frequency interface configured to pull time series data from TIBCO® 700. SIQ 704 then collects time series data from UIQ 702 with relatively high frequency for storage in a queue. Adapters 706 include various software adapters that allow the various modules described herein to communicate with one another. Data encryption 708 is configured to encrypt the time series data that is queued by SIQ 704. JMS mule 710 provides a data transport service to move encrypted time series data from data encryption 708 to dual port FW 712. Encrypted time series data 760 exits intake cloud 612 and is then formatted within formatting cloud 614, as described in greater detail below.

Figure 8:
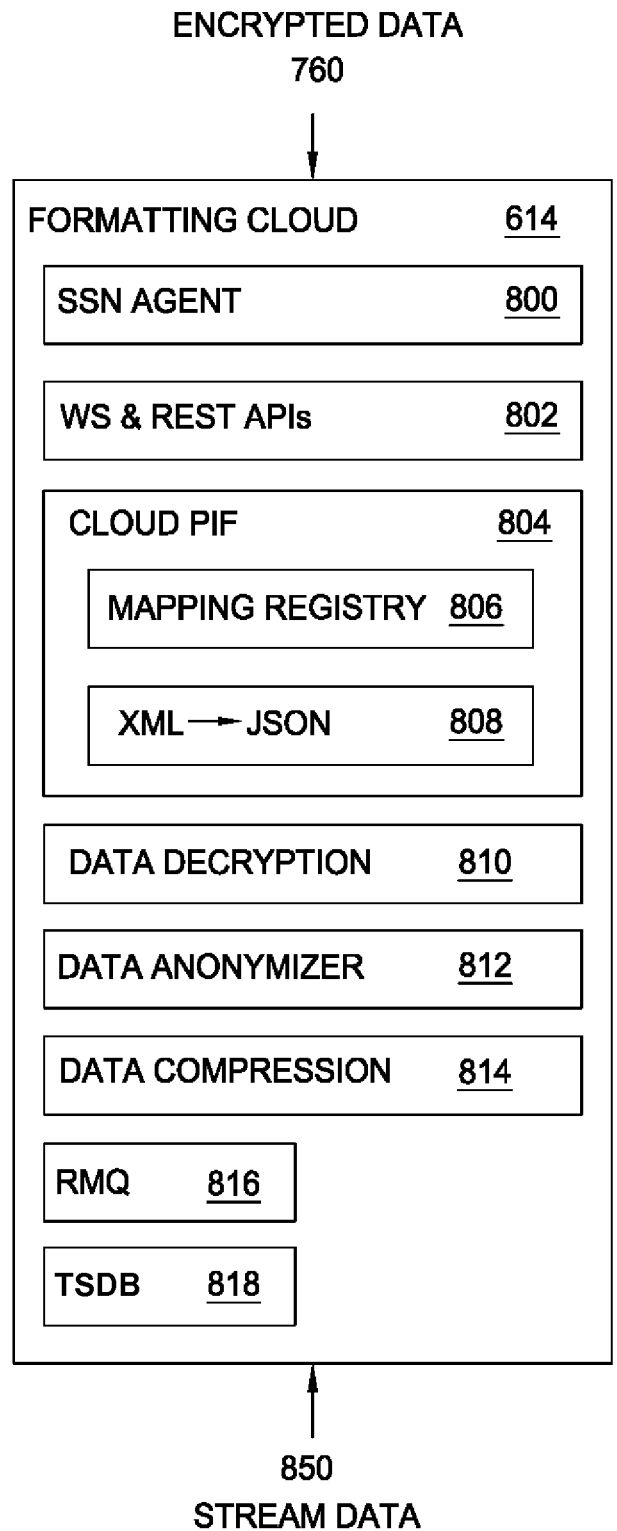
FIG. 8 illustrates exemplary software modules that are implemented in conjunction with the formatting cloud of FIG. 6, according to one embodiment of the present invention.

FIG. 8 illustrates exemplary software modules that are implemented in conjunction with the formatting cloud of FIG. 6, according to one embodiment of the present invention. As shown, formatting cloud 614 includes SilverSpring Networks (SSN) Agent 800, web service (WS) and representational state transfer (REST) APIs 802, cloud physical interface (PIF) 804 which includes mapping registry 806 and XML→JSON 808, data decryption 810, data anonymizer 812, data compression 814, rabbitMQ (RMQ) 816, and time series database (TSDB) 818.

Persons skilled in the art will understand that some of the software modules shown in FIG. 8 are commonly associated with specific vendors and may represent specific brands. However, these specific modules are provided to illustrate one possible implementation of the general functionality associated with formatting cloud 614, and are not meant to limit the scope of the present invention to the particular vendors/brands shown. In addition, although specific data types may be shown, such as, e.g., JSON, among others, the techniques described herein are not limited to those specific data types, and may be practiced with any technically feasible type of data.

SSN agent 800 is a software controller for managing formatting cloud 614. WS and REST APIs 802 provide a set or uniform resource indicators (URIs) for performing various operations with formatting cloud 614. Cloud PIF 808 receives XML data and converts that data to JSON using mapping registry 806 and XML→JSON 808. Data decryption 810 decrypts the encrypted time series data received from intake cloud 612. Data anonymizer 812 obfuscates certain identifying information from the decrypted data. Data compression 814 compresses the decrypted, anonymous data and then stores that data in RMQ 816. In one embodiment, TSDB 818 may also be used to store that data. TSDB 818 may be omitted in some embodiments. The decrypted anonymous data may then exit formatting cloud 614 as stream data 850. Stream data 850 may be consumed by distributed processing cloud 620 or real-time processing cloud 630.

Figure 9:
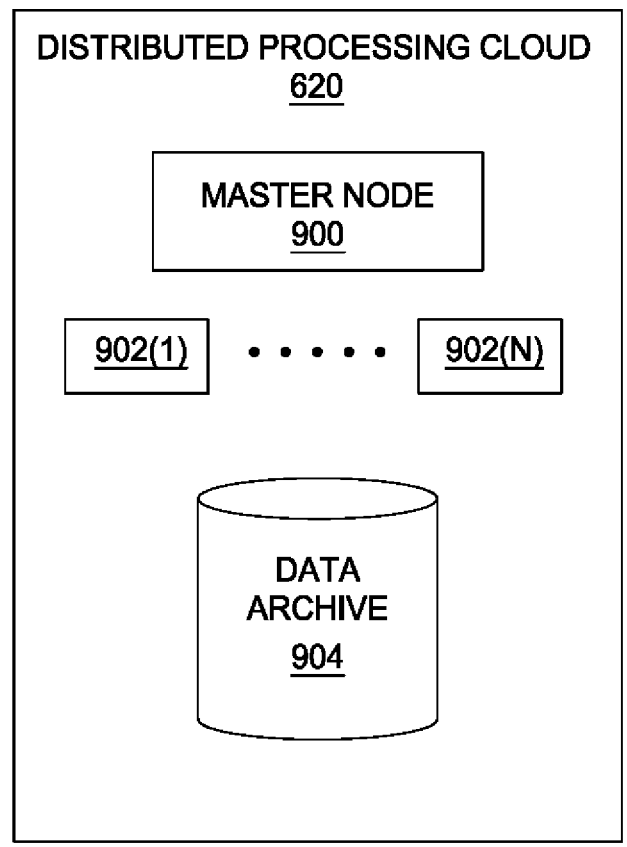
FIG. 9 illustrates exemplary software modules that are implemented in conjunction with the distributed processing cloud of FIG. 6, according to one embodiment of the present invention.

FIG. 9 illustrates exemplary software modules that are implemented in conjunction with the distributed processing cloud of FIG. 6, according to one embodiment of the present invention. As shown, distributed processing cloud 620 includes a master node 900 and various nodes 902(1) through 902(N). Distributed processing cloud 900 also includes a data archive 904.

Persons skilled in the art will understand that some of the various software modules shown in FIG. 9 are commonly associated with specific vendors and may represent specific brands. However, these specific modules are provided to illustrate one possible implementation of the general functionality associated with distributed processing cloud 620, and are not meant to limit the scope of the present invention to the particular vendors/brands shown. In addition, although specific data types may be shown, such as, e.g., JSON, among others, the techniques described herein are not limited to those specific data types, and may be practiced with any technically feasible type of data.

Master node 900 and slave nodes 902 are configured to perform distributed, parallel processing operations on stream data. Master node 900 and slave nodes 902 may form a Hadoop processing environment or any other type of distributed processing cluster or architecture. Data archive 904 includes historical stream data collected from data ingestion cloud 610 over long time scales. Master node 900 and slave nodes 902 may perform a variety of different processing tasks with the data stored in data archive 904. Data archive 904 may also be exposed to customers, and may be searchable via customer devices 950.

Figure 10:
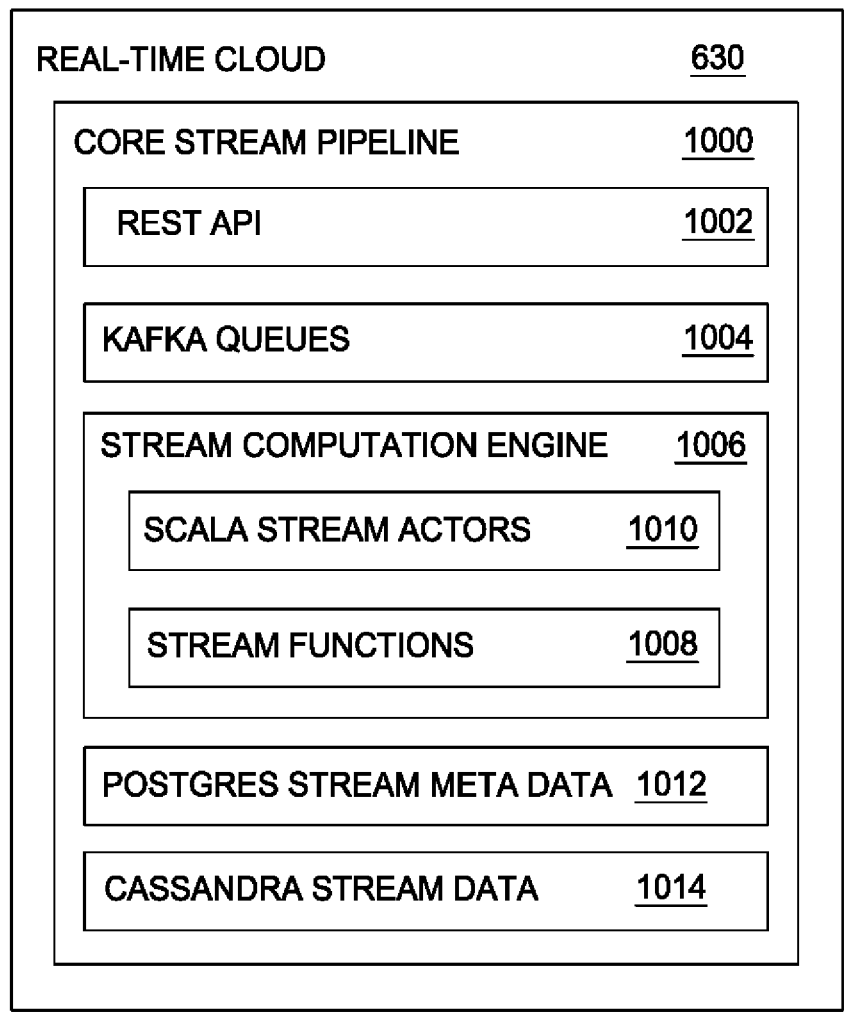
FIG. 10 illustrates exemplary software modules that are implemented in conjunction with the real-time processing cloud of FIG. 6, according to one embodiment of the present invention.

FIG. 10 illustrates exemplary software modules that are implemented in conjunction with the real-time processing cloud of FIG. 6, according to one embodiment of the present invention. As shown, real-time processing cloud 630 includes a core stream pipeline 1000 that includes REST API 1002, Kafka queues 1004, stream computation engine 1006, stream functions 1008, Scala stream actors 1010, Postgres stream meta data 1012, and Cassandra stream data 1014.

Persons skilled in the art will understand that some of the various software modules shown in FIG. 10 are commonly associated with specific vendors and may represent specific brands. However, these specific modules are provided to illustrate one possible implementation of the general functionality associated with real-time processing cloud 630, and are not meant to limit the scope of the present invention to the particular vendors/brands shown. In addition, although specific data types may be shown, such as, e.g., JSON, among others, the techniques described herein are not limited to those specific data types, and may be practiced with any technically feasible type of data.

REST API 1002 provides various URIs for configuring data streams. Kafka queues 1004 are configured to queue stream data, including JSON objects and generic messages. Stream computation engine 1006 performs operations with data streams by executing Scala stream actors 1010. Each Scala stream actor 1010 is a software construct configured to call one or more stream functions 1008. A stream function 1008 may be any operation that can be performed with stream data. For example, a stream function 1008 could be a sum function, a minimum function, a maximum function, an average function, a function that indicates the fraction of elements in an array that meet a given condition, an interpolation function, a customer function, and so forth. Stream functions 1008 may also have configurable parameters, such as, for example, a configurable window within which to calculate an average value, among other parameters relevant to time series computations. The Scala stream actor 1010 that calls the stream function 1008 may configure these parameters, among other possibilities.

Each Scala stream actor 1010 may execute a sequence of stream functions and, potentially, call other stream actors. For example, a first Scala stream actor 1010 could execute a series of stream functions, and upon completion of those functions, call a second Scala stream actor 1010 that would execute a different series of stream functions. Scala stream actors 1010 are generally implemented in the Scala programming language, although any technically feasible programming language may also suffice.

During stream processing, core stream pipeline 1000 may execute a multitude of Scala stream actors 1010 in parallel with one another to perform real-time processing on data streams. Customers may configure Scala stream actors 1010 directly, or may simply subscribe to data streams generated by those actors. In various embodiments, real-time processing cloud 630 may push specific Scala stream actors 1010 out to nodes 230 in order to configure those nodes to perform "edge processing" on wireless mesh network 202 and stream network 500. With this approach, individual nodes can be configured to perform sequences of specific stream functions. Core stream pipeline 1000 is configured by operations center 640, described in greater detail below in conjunction with FIG. 11.

Figure 11:
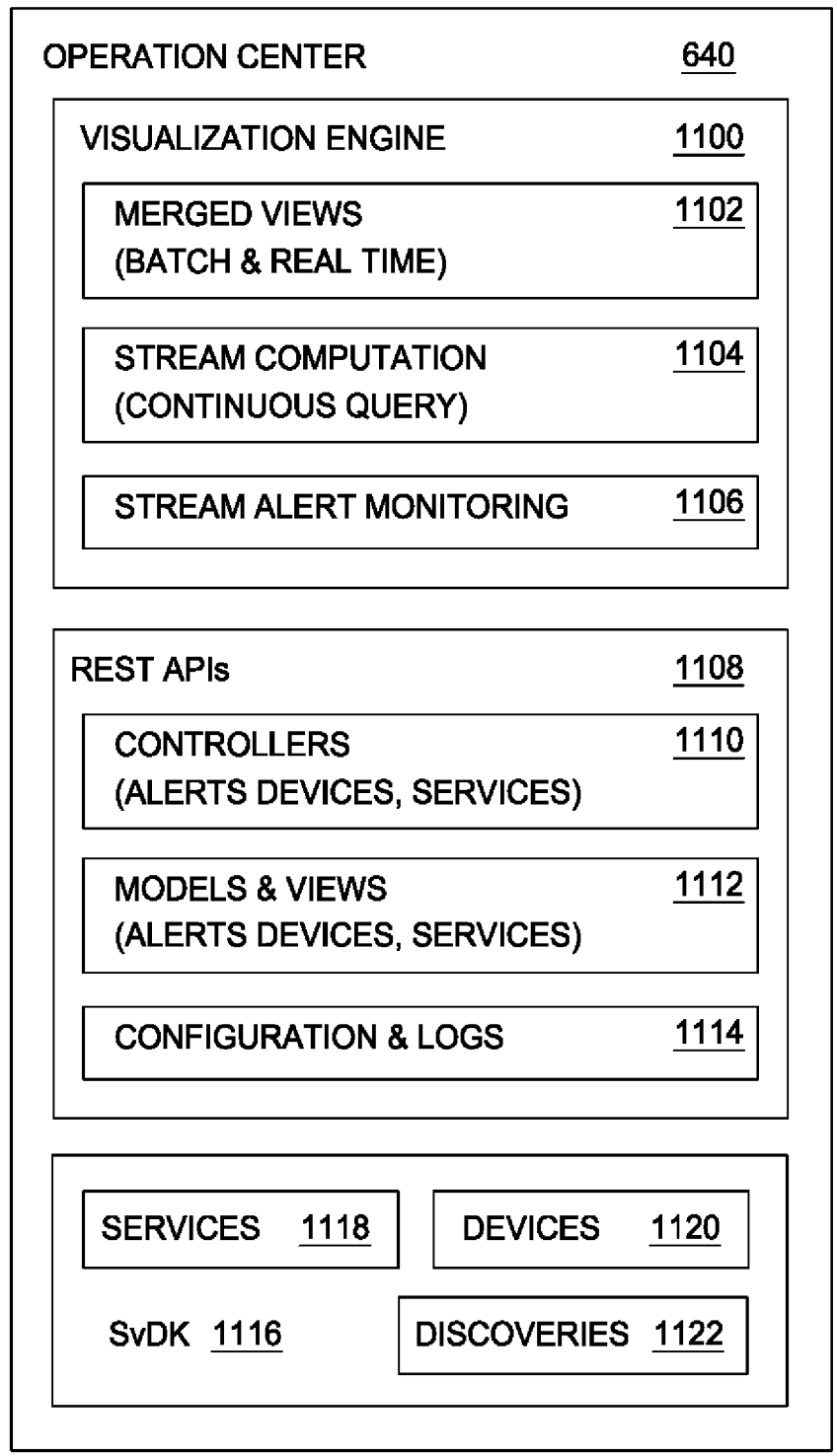
FIG. 11 illustrates exemplary software modules that are implemented in conjunction with the operations center of FIG. 6, according to one embodiment of the present invention.

FIG. 11 illustrates exemplary software modules that are implemented in conjunction with the operations center of FIG. 6, according to one embodiment of the present invention. As shown, operation center 640 includes visualization engine 1100, REST APIs 1108, and SvDK 1116. Visualization engine 1100 includes merged views 1102, stream computation 1104, and stream alert monitoring 1106. REST APIs 1108 includes controllers 1110, models and views 1112, and configuration and logs 114. SvDK includes services 1118, devices 1120, and discoveries 1122.

Visualization engine 1100 provides a back end for generating visualizations of data streams for customers. Customers may access visualization engine 110 via customer devices 650, as described in greater detail below in conjunction with FIG. 12. Merged views 1102 generate views of real-time data and batch (or historical) data. Stream computation engine 1104 allows new streams to be registered with visualization engine 1104. Stream alert monitoring 1106 monitors data streams and generates alerts when certain conditions are met or specific events occur.

REST APIs 1108 allow customers to perform various actions, including subscribing to streams, generating alerts, and so forth. Controllers 1110 include logic for performing these actions, while models and views 1112 provide data models and templates for viewing data acquired via REST APIs 1108. Configuration and logs 1114 include configuration data and log files.

SvDK 1116 is similar to SvDK 426 described above in conjunction with FIG. 4A, and includes a specification of various services 1118 a customer may subscribe to, a set of devices 1120 associated with those services, and discoveries 1122 that reflect communication between those devices.

Operation center 640 as a whole manages the operation of system 600, including the various processing clouds and stream network 500. Operation center 640 also provides back end processing needed to provide customer devices 650 with access to stream data. An exemplary customer device 650 configured to access operation center 640 is described in greater detail below on conjunction with FIG. 12.

Figure 12:
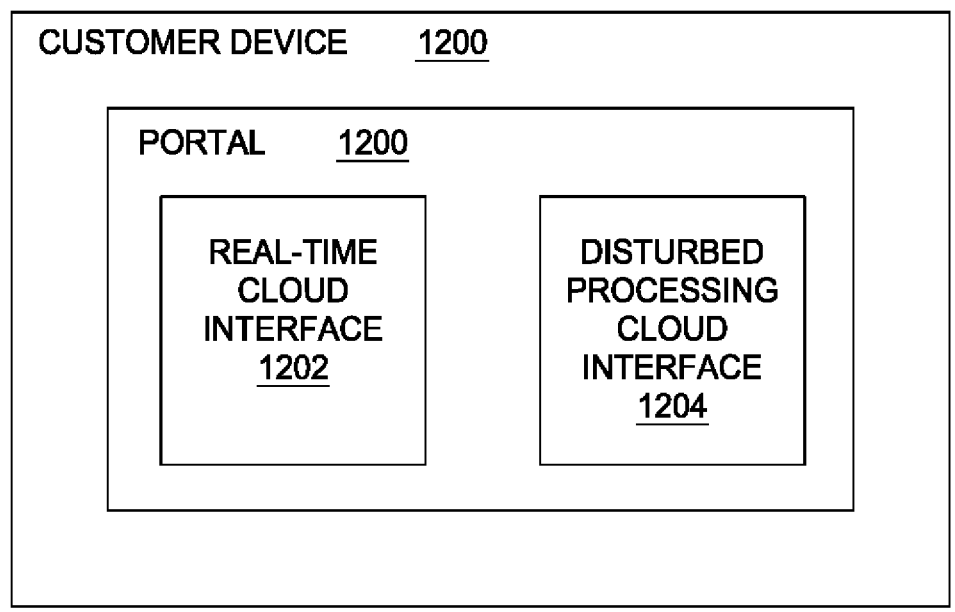
FIG. 12 illustrates exemplary software modules that are implemented in conjunction with the customer devices of FIG. 6, according to one embodiment of the present invention.

FIG. 12 illustrates exemplary software modules that are implemented in conjunction with the customer devices of FIG. 6, according to one embodiment of the present invention. As shown, customer device 650 includes a portal 1200 that includes a real-time cloud processing interface 1202 and a distributed cloud processing interface 1204. Portal 1200 may be a web browser configured to access any of the URIs provided by REST APIs 1108 shown in FIG. 11. Real-time cloud processing interface 1202 provides customers with access to data streams processed by real-time processing cloud 630. Distributed processing cloud interface 1204 provides customers with the ability to run queries against data archive 904 within distributed processing cloud 620.

Figure 13:
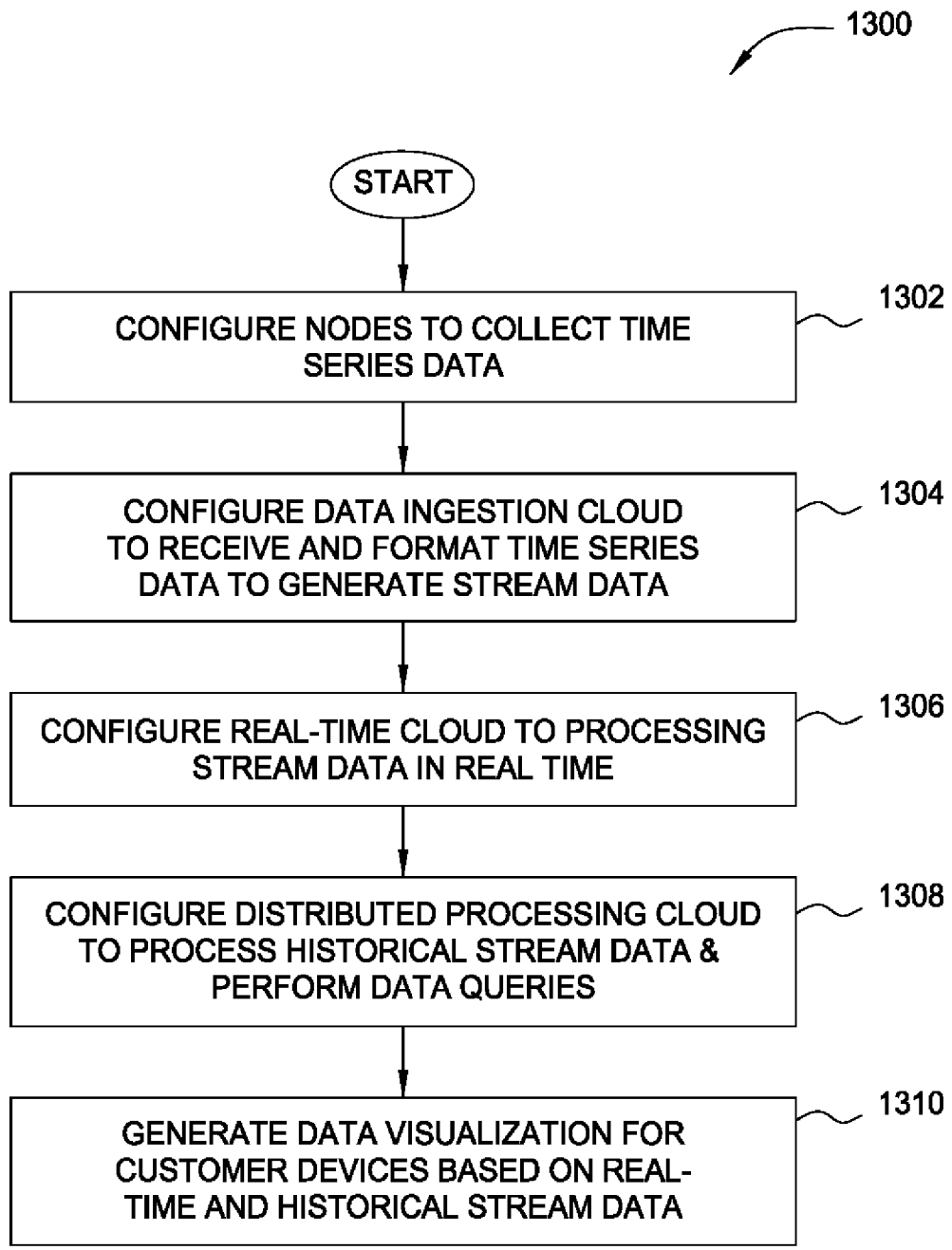
FIG. 13 is flow diagram of method steps for configuring one or more processing clouds to implement a stream network, according to one embodiment of the present invention.
Figure 14:
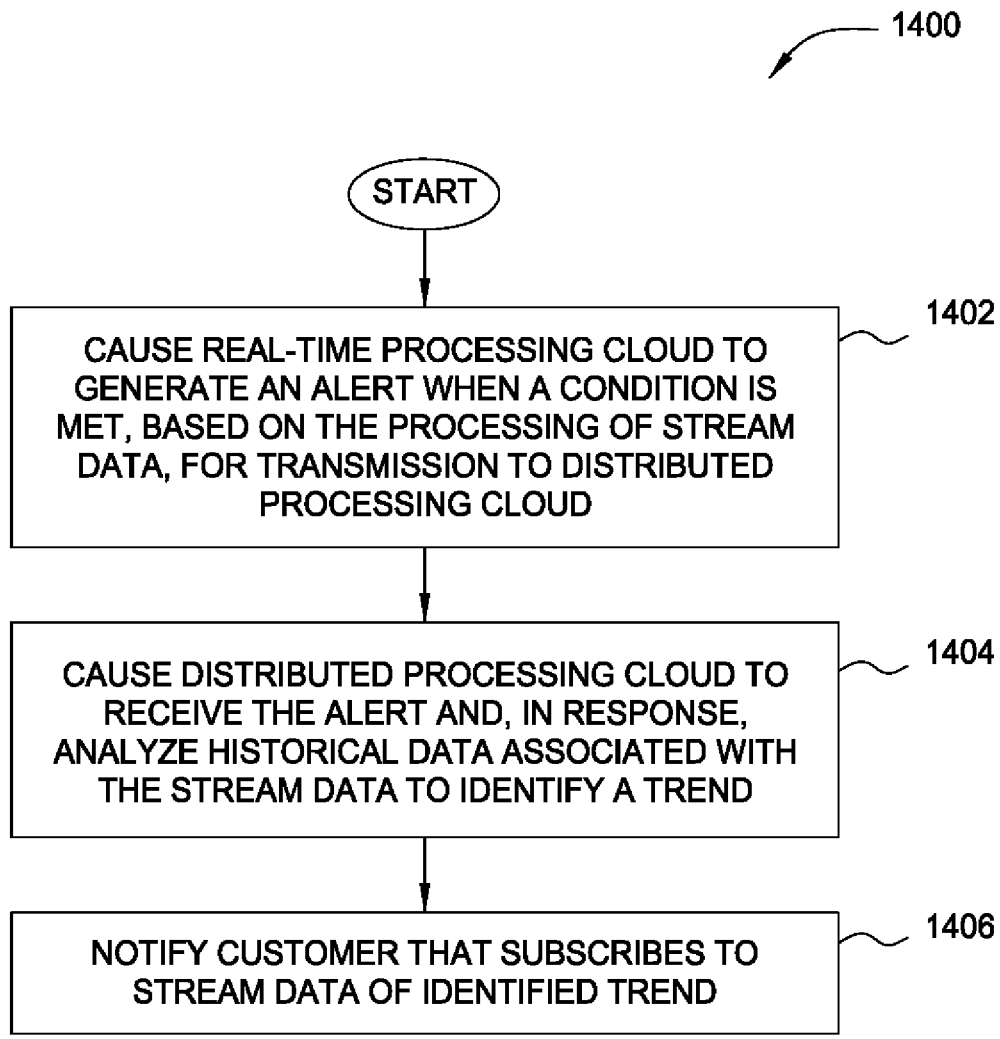
FIG. 14 is a flow diagram of method steps for triggering distributed processing of stream-based data, according to one embodiment of the present invention.
Figure 15:
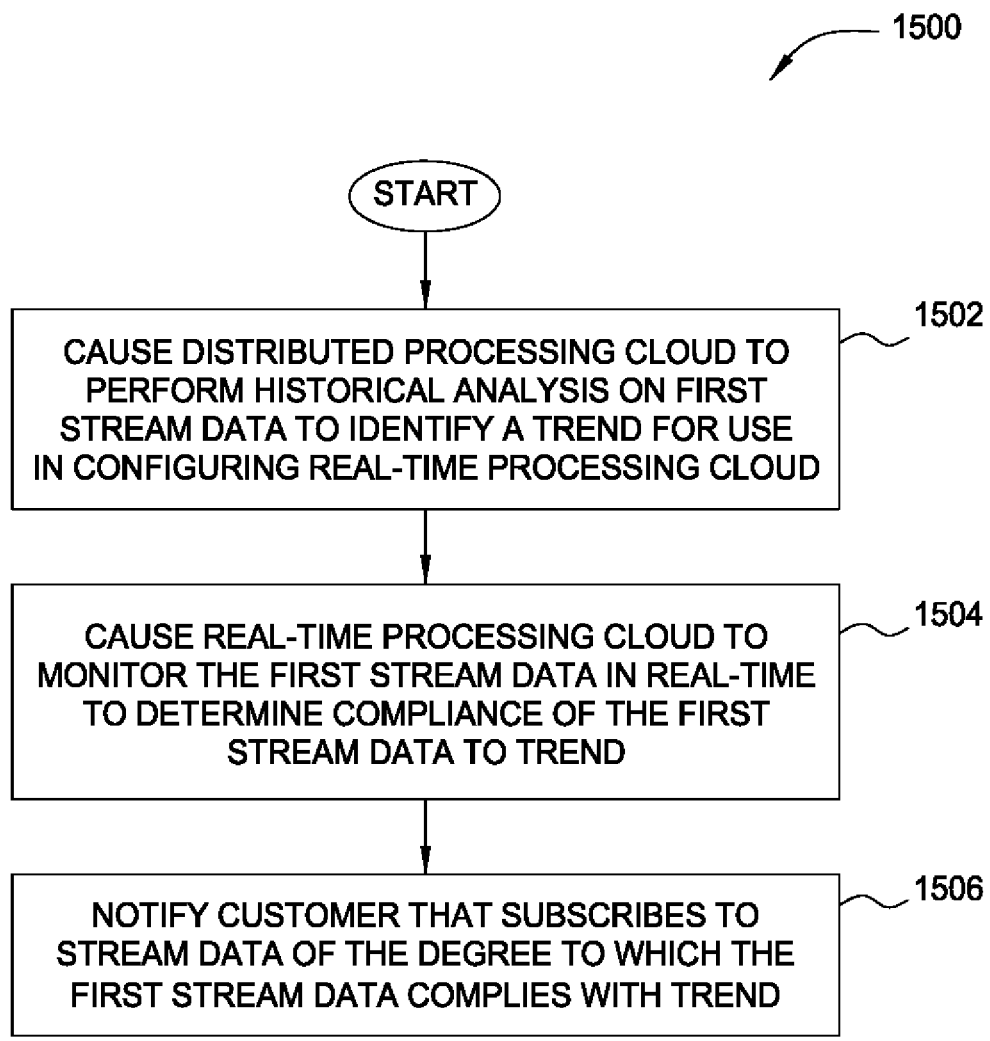
FIG. 15 is a flow diagram of method steps for triggering real-time processing of stream-based data, according to one embodiment of the present invention.

Referring generally to FIG. 7-12, persons skilled in the art will understand that the various exemplary software modules shown represent executable program code that, when executed by a processing unit, causes the processing unit to perform the various functionality described above. Generally, each of data ingestion cloud 610, distributed processing cloud 620, real-time processing cloud 630, operations center 640, and customer devices 650 includes a plurality of computing devices configured to execute software modules such as those described herein. Those software modules may be implemented via any technically feasible set of programming languages, beyond those explicitly mentioned above. FIGS. 13-15 describe techniques for configuring the processing clouds described herein, as well as data processing strategies implemented by those clouds.

Techniques for Configuring and Coordinating Processing Clouds

FIG. 13 is flow diagram of method steps for configuring one or more processing clouds to implement a stream network, according to one embodiment of the present invention. Although the method steps are described in conjunction with the systems of FIGS. 1-12, persons skilled in the art will understand that any system configured to perform the method steps, in any order, is within the scope of the present invention.

A method 1300 begins at step 1302, where server machine 254 within operations center 640 configures nodes 230 within wireless mesh network 202 to collect time series data. The time series data includes a sequence of data values and corresponding timestamps indicating times when each data value was collected.

At step 1304, server machine 254 configures data ingestion cloud 610 to receive the time series data and to then format that data in order to generate a data stream. Server machine 254 may configure intake cloud 612 to execute on a first cloud computing environment and to receive the time series data, and then configure formatting cloud 614 to execute on a second cloud computing environment and to format the time series data. Alternatively, server machine 254 may configure both intake cloud 612 and formatting cloud 614 to execute within the same cloud computing environment.

At step 1306, server machine 254 configures real-time processing cloud 630 to process the stream data generated by data ingestion cloud 610 in real time. In doing so, server machine 254 may configure one or more instances of virtual computing devices to execute a core stream pipeline such as that shown in FIG. 10.

At step 1308, server machine 254 configures distributed processing cloud 620 to collect and process historical stream data, and to perform data queries in response to commands issued by customer devices 650. In doing so, server machine 254 may cause distributed processing cloud to accumulate stream data over long periods of time from data ingestion cloud 610, and to store that accumulated stream data within data archive 904. Server machine 254 may also configure master node 900 and slave nodes 902 to perform distributed processing of the data stored in data archive 904.

At step 1310, server machine 254 generates data visualizations for customer devices 650 based on real-time stream data processed by real-time processing cloud 630 and historical data processed by distributed processing cloud 620. In one embodiment, server machine 254 implements a web service that responds to requests from customer devices 650 to generate visualizations.

Once server machine 254 has completed the above configuration steps, server machine 254 may further configure distributed processing cloud 620 and real-time processing cloud 630 to interact with one another when certain conditions are met, as described in greater detail below in conjunction with FIGS. 14-15.

FIG. 14 is a flow diagram of method steps for triggering distributed processing of stream-based data, according to one embodiment of the present invention. Although the method steps are described in conjunction with the systems of FIGS. 1-12, persons skilled in the art will understand that any system configured to perform the method steps, in any order, is within the scope of the present invention.

As shown, a method 14 begins at step 1402, where server machine 254 causes real-time processing cloud 630 to generate an alert when a condition is met, based on the processing of stream data, for transmission to distributed processing cloud 620. For example, the data stream could reflect a time series of temperature values recorded by a node, and the condition could be the temperature values falling beneath a certain temperature threshold.

At step 1404, server machine 254 causes distributed processing cloud 620 to receive the alert from real-time processing cloud 630, and, in response, to analyze historical data associated with the data stream to identify a trend. Returning to the example above, server machine 254 could cause distributed processing cloud 620 to analyze historical temperature values gathered by the node and to identify trends in that historical data. In this example, the trend could indicate a seasonal variation in temperature, or the onset of inclement weather.

At step 1406, server machine 254 notifies a customer who subscribes to the data stream of the trend that has been identified. In doing so, server machine 254 may indicate to the customer predicted values of the data stream determined based on the trend. For example, if the historical analysis indicated that the temperature change resulted from seasonal temperature variations, then server machine 254 could predict future temperature changes based on those observed during previous years.

With the approach, processing that occurs within real-time processing cloud 630 may trigger a different type of processing on distributed processing cloud 620. Distributed processing cloud 620 may also trigger processing real-time processing cloud 630, as described in greater detail below in conjunction with FIG. 15.

FIG. 15 is a flow diagram of method steps for triggering real-time processing of stream-based data, according to one embodiment of the present invention. Although the method steps are described in conjunction with the systems of FIGS. 1-12, persons skilled in the art will understand that any system configured to perform the method steps, in any order, is within the scope of the present invention.

As shown, a method 1500 begins at step 1502, where server machine 254 causes distributed processing cloud 620 to perform a historical analysis on a first data stream to identify a trend for use in configuring real-time processing cloud 630. The trend could be a periodic repetition of specific data values, or a predictable change in data values such as a gradual increase or decline in those data values. When a trend is identified, distributed processing cloud 620 notifies real-time processing cloud 630 of that trend.

At step 1504, server machine 254 causes real-time processing cloud 630 to monitor the first data stream, in real time, to determine the degree to which that data stream complies with the identified trend. For example, if distributed processing cloud 620 determines that data values associated with the first data stream are steadily increasing over time, then real-time processing cloud 630 could determine whether those data values continue to increase as new data values become available.

At step 1506, server machine 254 notifies a customer who subscribes to the first data stream of the degree to which the first data stream complies with the trend. This approach may be applied to detect a variety of different types of trends, including those associated with fraud and other forms of non-technical loss. Distributed processing cloud 620 may periodically analyze some or all of the stream data stored in data archive 904, and, in response to that analysis, configure real-time processing cloud 630 to specifically monitor certain data streams for which trends have been detected.

Persons skilled in the art will recognize that the methods 1400 and 1500 described above may be implemented simultaneously, meaning that that real-time processing cloud 630 could trigger processing on distributed processing cloud 620, and distributed processing cloud 620 could, in parallel, trigger processing on real-time processing cloud 630.

In sum, nodes within a wireless mesh network are configured to monitor time series data associated with a utility network (or any other device network), including voltage fluctuations, current levels, temperature data, humidity measurements, and other observable physical quantities. A server coupled to the wireless mesh network configures a data ingestion cloud to receive and process the time series data to generate data streams. The server also configures a distributed processing cloud to perform historical analysis on data streams, and a real-time processing cloud to perform real-time analysis on data streams. The distributed processing cloud and the real-time processing cloud may interoperate with one another in response to processing the data streams. The techniques described herein allow the delivery of "data-as-a-service" (DaaS) that represents an interface between the traditional software-as-a-service (SaaS) and platform-as-a-service (PaaS) approaches.

One advantage of the unique architecture described above is that the real-time processing cloud and the distributed processing cloud can interoperate to identify a greater range of events occurring within the utility network compared to traditional approaches. In addition, those different processing clouds provide customers with greater visibility into the types of events occurring within the utility network.

The descriptions of the various embodiments have been presented for purposes of illustration, but are not intended to be exhaustive or limited to the embodiments disclosed. Many modifications and variations will be apparent to those of ordinary skill in the art without departing from the scope and spirit of the described embodiments.

Aspects of the present embodiments may be embodied as a system, method or computer program product. Accordingly, aspects of the present disclosure may take the form of an entirely hardware embodiment, an entirely software embodiment (including firmware, resident software, micro-code, etc.) or an embodiment combining software and hardware aspects that may all generally be referred to herein as a "circuit," "module" or "system." Furthermore, aspects of the present disclosure may take the form of a computer program product embodied in one or more computer readable medium(s) having computer readable program code embodied thereon.

Any combination of one or more computer readable medium(s) may be utilized. The computer readable medium may be a computer readable signal medium or a computer readable storage medium. A computer readable storage medium may be, for example, but not limited to, an electronic, magnetic, optical, electromagnetic, infrared, or semiconductor system, apparatus, or device, or any suitable combination of the foregoing. More specific examples (a non-exhaustive list) of the computer readable storage medium would include the following: an electrical connection having one or more wires, a portable computer diskette, a hard disk, a random access memory (RAM), a read-only memory (ROM), an erasable programmable read-only memory (EPROM or Flash memory), an optical fiber, a portable compact disc read-only memory (CD-ROM), an optical storage device, a magnetic storage device, or any suitable combination of the foregoing. In the context of this document, a computer readable storage medium may be any tangible medium that can contain, or store a program for use by or in connection with an instruction execution system, apparatus, or device.

Aspects of the present disclosure are described above with reference to flowchart illustrations and/or block diagrams of methods, apparatus (systems) and computer program products according to embodiments of the disclosure. It will be understood that each block of the flowchart illustrations and/or block diagrams, and combinations of blocks in the flowchart illustrations and/or block diagrams, can be implemented by computer program instructions. These computer program instructions may be provided to a processor of a general purpose computer, special purpose computer, or other programmable data processing apparatus to produce a machine, such that the instructions, which execute via the processor of the computer or other programmable data processing apparatus, enable the implementation of the functions/acts specified in the flowchart and/or block diagram block or blocks. Such processors may be, without limitation, general purpose processors, special-purpose processors, application-specific processors, or field-programmable processors.

Embodiments of the disclosure may be provided to end users through a cloud computing infrastructure. Cloud computing generally refers to the provision of scalable computing resources as a service over a network. More formally, cloud computing may be defined as a computing capability that provides an abstraction between the computing resource and its underlying technical architecture (e.g., servers, storage, networks), enabling convenient, on-demand network access to a shared pool of configurable computing resources that can be rapidly provisioned and released with minimal management effort or service provider interaction. Thus, cloud computing allows a user to access virtual computing resources (e.g., storage, data, applications, and even complete virtualized computing systems) in "the cloud," without regard for the underlying physical systems (or locations of those systems) used to provide the computing resources.

Typically, cloud computing resources are provided to a user on a pay-per-use basis, where users are charged only for the computing resources actually used (e.g. an amount of storage space consumed by a user or a number of virtualized systems instantiated by the user). A user can access any of the resources that reside in the cloud at any time, and from anywhere across the Internet. In context of the present disclosure, a user may access applications (e.g., video processing and/or speech analysis applications) or related data available in the cloud.

The flowchart and block diagrams in the Figures illustrate the architecture, functionality, and operation of possible implementations of systems, methods and computer program products according to various embodiments of the present disclosure. In this regard, each block in the flowchart or block diagrams may represent a module, segment, or portion of code, which comprises one or more executable instructions for implementing the specified logical function(s). It should also be noted that, in some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts, or combinations of special purpose hardware and computer instructions.

While the preceding is directed to embodiments of the present disclosure, other and further embodiments of the disclosure may be devised without departing from the basic scope thereof, and the scope thereof is determined by the claims that follow.

The invention claimed is:

1. A computer-implemented method for generating network-based data services, the method comprising:
    configuring a first cloud computing environment to acquire a sequence of data values and convert the sequence of data values into a first data stream;
    configuring a second cloud computing environment to accumulate the first data stream into a data archive and to perform a historical analysis on the first data stream to identify a first trend associated with the first data stream;
    configuring a third cloud computing environment to perform one or more real-time processing operations on the first data stream to determine that a first condition associated with the first data stream has been met; and
    providing a subscriber to the network-based data services with access to the first data stream, the first trend, and an indication that the first condition has been met.

2. The computer-implemented method of claim 1, wherein configuring the first cloud computing environment comprises configuring the first cloud computing environment to:
    receive the sequence of data values;
    encrypt the sequence of data values to generate encrypted data; and
    push the encrypted data into a first queue that resides behind a firewall.

3. The computer-implemented method of claim 2, wherein configuring the first cloud computing environment further comprises configuring the first cloud computing environment to:
    retrieve the encrypted data from the first queue;
    convert the encrypted data from a first format to a second format;
    decrypt the encrypted data to generate decrypted data;
    generate anonymized data based on the decrypted data;
    compress the anonymized data to generate the first data stream; and
    push the first data stream onto a second queue.

4. The computer-implemented method of claim 1, wherein configuring the second cloud computing environment comprises:
    configuring a master node and a plurality of slave nodes to implement a distributed, parallel processing environment; and
    configuring the data archive to receive data streams and queries and, in response to one or more of the queries, to provide access to data associated with the first data stream.

5. The computer-implemented method of claim 1, wherein configuring the third cloud computing environment comprises:
    configuring a message queue to queue the first data stream;
    configuring a stream actor to execute a sequence of stream functions on the first data stream to generate first stream data; and
    configuring a database to store the first stream data.

6. The computer-implemented method of claim 1, wherein creating the data service comprises causing a web-based service to provide access, via a uniform resource indicator (URI), to the first data stream, the first trend, and the indication that the first condition has been met.

7. The computer-implemented method of claim 1, further comprising configuring the second cloud computing environment to identify the first trend associated with the first data stream and, in response, trigger the third cloud computing environment to perform the real-time processing analysis.

8. The computer-implemented method of claim 7, wherein the first condition is that the first data stream complies with the first trend.

9. The computer-implemented method of claim 1, further comprising configuring the third cloud-computing environment to determine that the first condition has been met and, in response to the first condition being met, triggering the second cloud computing environment to perform the historical analysis.

10. The computer-implemented method of claim 9, wherein the first trend indicates that the first condition associated with the first data stream was previously met.

11. A computer-implemented method for performing a cloud computing operation, the method comprising:
- configuring a first cloud computing environment to perform a first processing operation on a sequence of data values to produce a first result;
- configuring a second cloud computing environment to perform a second processing operation on the sequence of data values, in response to the first result, to produce a second result; and
- generating a notification based on the first result and the second result.

12. The computer-implemented method of claim 11, wherein the first cloud computing environment comprises a distributed processing cloud, the first operation comprises a historical analysis on the sequence of data values, and the first result indicates a trend associated with the sequence of data values.

13. The computer-implemented method of claim 12, wherein the second cloud computing environment comprises a real-time processing cloud, the second operation comprises a real-time analysis on the sequence of data values, and the second result indicates that the sequence of data values follows the trend.

14. The computer implemented method of claim 11, wherein the first cloud computing environment comprises a real-time processing cloud, the first operation comprises a real-time analysis on the sequence of data values, and the first result indicates that a condition associated with the sequence of data values has been met.

15. The computer implemented method of claim 14, wherein the second cloud computing environment comprises a distributed processing cloud, the second operation comprises a historical analysis on the sequence of data values, and the second result indicates that the sequence of data values has previously met the condition.

16. The computer-implemented method of claim 11, wherein the sequence of data values is generated from a plurality of sensor readings collected by a node within a network, and wherein the node is configured to monitor a utility distribution infrastructure.

17. A system for performing historical and real-time analysis on a sequence of data values, comprising:
- a first cloud computing environment, configured to:
  - accumulate the sequence of data values for storage in a data archive, and
  - perform a historical analysis on data stored in the data archive;
- a second cloud computing environment configured to:
  - monitor the sequence of data values in real time, and
  - determine when one or more conditions associated with sequence of data values has been met; and
- a computing device, configured to:
  - instantiate the first cloud computing environment,
  - instantiate the second cloud computing environment, and
  - configure a network of nodes coupled to an underlying network to record data associated with the underlying network and to transmit the data to the first cloud computing environment and to the second cloud computing environment.

18. The system of claim 17, wherein the first cloud computing environment is further configured to cause the second cloud computing environment to monitor the sequence of data values and determine when the one or more conditions have been met in response to performing the historical analysis on the sequence of data values.

19. The system of claim 17, wherein the second cloud computing environment is further configured to cause the first cloud computing environment to perform the historical analysis in response to determining that the one or more conditions have been met.

20. The system of claim 17, wherein the first cloud computing environment provides access to a first data service that indicates results associated with the historical analysis, and the second cloud computing environment provides access to a second data service that indicates when the one or more conditions have been met.

* * * * *